United States Patent
Urano et al.

(10) Patent No.: US 7,208,809 B2
(45) Date of Patent: Apr. 24, 2007

(54) SEMICONDUCTOR DEVICE HAVING MEMS

(75) Inventors: Masami Urano, Kanagawa (JP);
Hiromu Ishii, Kanagawa (JP);
Toshishige Shimamura, Kanagawa (JP); Yasuyuki Tanabe, Kanagawa (JP);
Katsuyuki Machida, Kanagawa (JP);
Tomomi Sakata, Saitama (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 243 days.

(21) Appl. No.: 10/664,258

(22) Filed: Sep. 17, 2003

(65) Prior Publication Data

US 2004/0063325 A1    Apr. 1, 2004

(30) Foreign Application Priority Data

| Sep. 19, 2002 | (JP) | ............................. 2002-272897 |
| Sep. 19, 2002 | (JP) | ............................. 2002-272905 |
| Oct. 10, 2002 | (JP) | ............................. 2002-297835 |
| Nov. 1, 2002  | (JP) | ............................. 2002-319478 |

(51) Int. Cl.
*H01L 31/232* (2006.01)

(52) U.S. Cl. ............................. 257/432; 257/E29.324
(58) Field of Classification Search ................ 257/414, 257/415, 431, 432, E29.324, 444
See application file for complete search history.

(56) References Cited

U.S. PATENT DOCUMENTS 6,275,326 B1    8/2001    Bhalla et al.

6,504,385 B2 *  1/2003    Hartwell et al. ............ 324/662
2002/0071169 A1   6/2002    Bowers et al.

FOREIGN PATENT DOCUMENTS

| JP | 04-211218 | 8/1992 |
| JP | 05-136357 | 6/1993 |
| JP | 09-236762 | 9/1997 |
| JP | 2000-338445 | 12/2000 |
| JP | 2001-198897 A | 7/2001 |
| JP | 2001-311900 | 11/2001 |
| JP | 20002-169008 | 6/2002 |
| JP | 2002-189178 A | 7/2002 |

OTHER PUBLICATIONS

"Design and fabrication of micromirror supported by electroplated nickel posts", Chung, et al., Elsevier Sequoia S.A., Lausanne, vol. 54, No. 1-3, Jun. 1, 1996, pp. 464-467.
"Infrared Micromirror Array with Large Pixel Size and Large Deflection Angle", B. Wagner, et al., 1997 INternational Colnf. on Solid State Sensors . . . , Jun. 16-19, 1997, papers No. 3A1.01-4D3.14P, Int'l Conf., vol., 2, Jun. 1997, pp. 75-78.

(Continued)

*Primary Examiner*—Monica Lewis
(74) *Attorney, Agent, or Firm*—Blakely Sokoloff Taylor & Zafman

(57) ABSTRACT

In a semiconductor device having a MEMS according to this invention, a plurality of units having movable portions for constituting a MEMS are monolithically mounted on a semiconductor substrate on which an integrated circuit including a driving circuit, sensor circuit, memory, and processor is formed. Each unit has a processor, memory, driving circuit, and sensor circuit.

5 Claims, 22 Drawing Sheets

OTHER PUBLICATIONS

Optical Networking: MEMS Mirror Control, ANASOG Devices.

Madanagopal et al., Real Time Software Control of Spring Suspended Micro-Electro-Mechanical (MEM) Devices For Precision Optical Positioning Applications, 2002 International Conference on Optical MEMs 2002, Aug. 2002, pp. 41-42.

Hirao et al., "Circuit Design for High-Speed MEMS Mirror Drive", 2002 IEICE CommunicationsSociety Conference, Sep. 11, 2002, pp. 445.

Transistor Technology, the Issue of May 2002, pp. 207-212.

"MEMS: Micro Technology, Mega Impact", Circuits & Devices, pp. 14-25, Mar. 2001.

Petterson et al., "MOEMS Electrostatic Scanning Micromirrors Design and Fabrication", Electrochemical Society Proceedings, vol. 2002-4, pp. 369-380.

Sawada et al., "Single Crystalline Mirror Actuated Electrostatically by terraced Electrodes With High-Aspect Ratio Torsion Spring", International Conference on Optical MEMS 2001, Sep. 26, 2001.

* cited by examiner

FIG. 16M
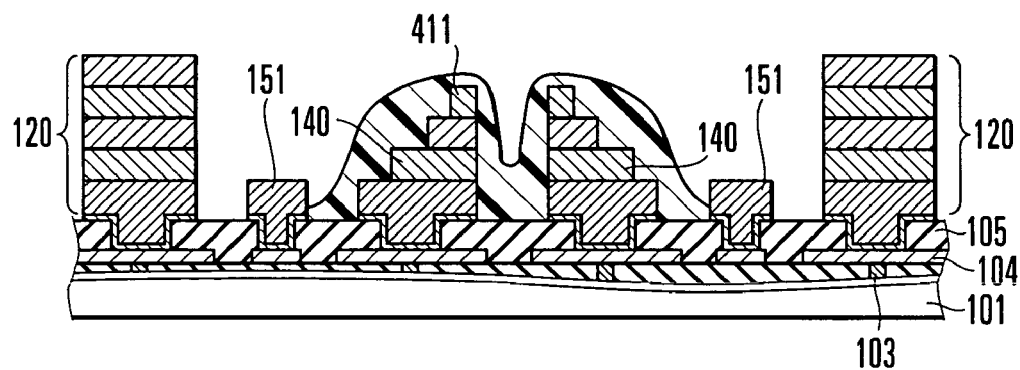
FIG. 16N
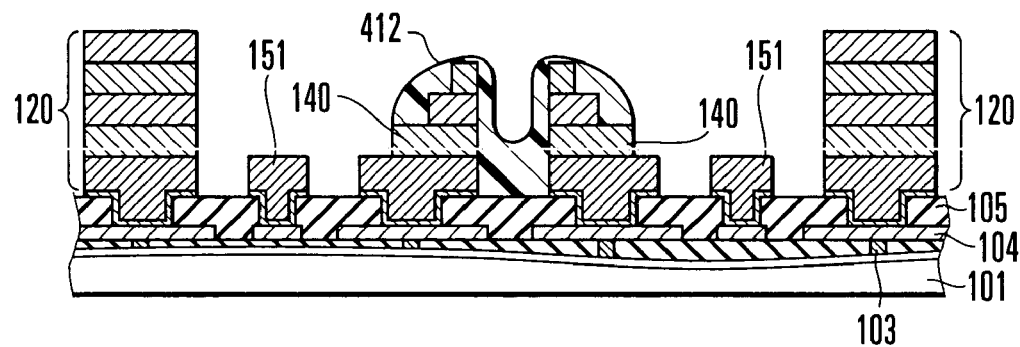
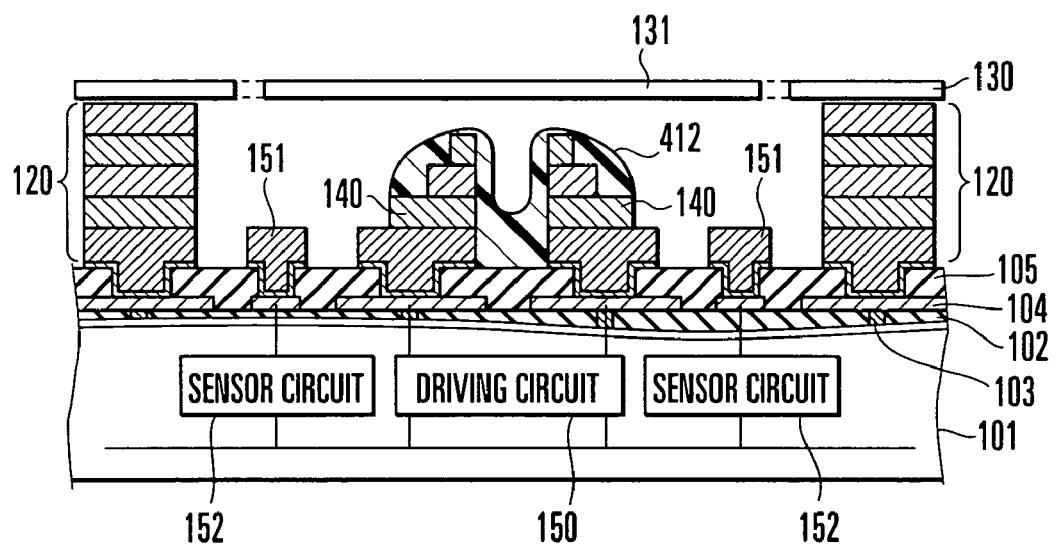
FIG. 17

SEMICONDUCTOR DEVICE HAVING MEMS

BACKGROUND OF THE INVENTION

The present invention relates to a semiconductor device which comprises a micromachine such as an optical switching device used for communication, measurement, or the like, and constructs a MEMS.

A MEMS (Micro Electro Mechanical Systems) having a micromachine formed by micropatterning has conventionally been known (see e.g., nonpatent references 1, 2, and 3). FIG. 20 shows an arrangement example of the MEMS. The MEMS shown in FIG. 20 comprises an electronic component 902 including at least one MEMS structure (micromachine) 901 formed by micropatterning, a control device 903 which generates a control signal for controlling the electronic component 902, and a control signal line 904 for supplying a control signal to the electronic component 902.

The control device 903 comprises a processor 905 which transmits predetermined control data and controls the operation of the MEMS structure 901, a memory 906 which holds the control program of the processor 905 and data necessary for the control program, an I/O 907 which inputs/outputs a signal outside the control device 903, a driving circuit 908 which generates a control signal to be supplied to the MEMS structure 901 on the basis of control data transferred from the processor 905, and a data bus 909 which connects the processor 905, memory 906, I/O 907, and driving circuits 908.

When the MEMS shown in FIG. 20 is, e.g., a MEMS optical switch, at least four control electrodes (not shown) are required to pivot a MEMS mirror (MEMS structure 901) on two axes, and control signals must be supplied from the driving circuit 908 to four control electrodes via four control signal lines 904. When the MEMS shown in FIG. 20 is, e.g., a MEMS mirror switch component in which 100 MEMS mirrors are mounted in an array, at least 400 driving circuits 908 and 400 control signal lines 904 are required. The driving circuit is generally comprised of a digital-to-analog converter (DAC) which converts a control signal into an analog signal, and an amplifier which amplifiers the output voltage of the DAC at a predetermined amplification factor. Mounting of driving circuits constituted by individual ICs requires many printed boards.

The above-mentioned prior arts are as follows:

"Optical Networking: MEMS Mirror Control", ANALOG DEVICES, Searched Sep. 18, 2002, Internet <http://www.analog.com/productSelection/signalChains/communications/comms_17.html>

K. V. Madanagopal et al., "Real Time Software Control Of Spring Suspended Micro-Electro-Mechanical (MEM) Devices For Precision Optical Positioning Applications", 2002 International Conference on Optical MEMs 2002, August, 2002, pp. 41–42

Hirao et al., "Circuit Design for High-Speed MEMS Mirror Drive", 2002 IEICE Communications Society Conference, Sep. 11, 2002, p. 445

As described above, in a conventional MEMS, the control device becomes large even if a MEMS structure is manufactured with a small size. Also, many control signal lines which connect a MEMS structure and control device are necessary, and it is difficult to downsize the MEMS.

SUMMARY OF THE INVENTION

It is, therefore, a principal object of the present invention to provide a MEMS capable of downsizing.

To achieve the above object, according to an aspect of the present invention, there is provided a semiconductor device having a MEMS, comprising a semiconductor substrate on which an integrated circuit is formed, and a plurality of units which are formed on the semiconductor substrate and comprise movable portions that physically move on the basis of a first electrical signal, each of the units comprising at least a control electrode which supplies a control signal for causing the movable portion to physically move, a driving circuit which outputs the control signal to the control electrode on the basis of the first electrical signal, a sensor electrode which detects physical motion of the movable portion, a sensor circuit which generates a second electrical signal corresponding to physical motion of the movable portion on the basis of a signal from the sensor electrode, a memory which holds an externally input setting value, and a processor which generates the first electrical signal on the basis of the setting value held in the memory, and controls output of the control signal from the driving circuit on the basis of the generated first electrical signal and the second electrical signal, thereby controlling operation of the movable portion, wherein the driving circuit, the sensor circuit, the memory, and the processor are constituted by part of the integrated circuit.

With this arrangement, motion of the movable portion serving as a MEMS structure can be controlled without using a large control device which controls motion of the MEMS structure and requiring many control signal lines. As a result, the present invention can downsize the MEMS.

BRIEF DESCRIPTION OF THE DRAWINGS

FIG. 17 is a sectional view showing a step subsequent to FIG. 16N in the example of the method of manufacturing a semiconductor device having a MEMS according to the sixth embodiment of the present invention;

DESCRIPTION OF THE PREFERRED EMBODIMENTS

Preferred embodiments of the present invention will be described in detail below with reference to the accompanying drawings.

First Embodiment

Figure 1:
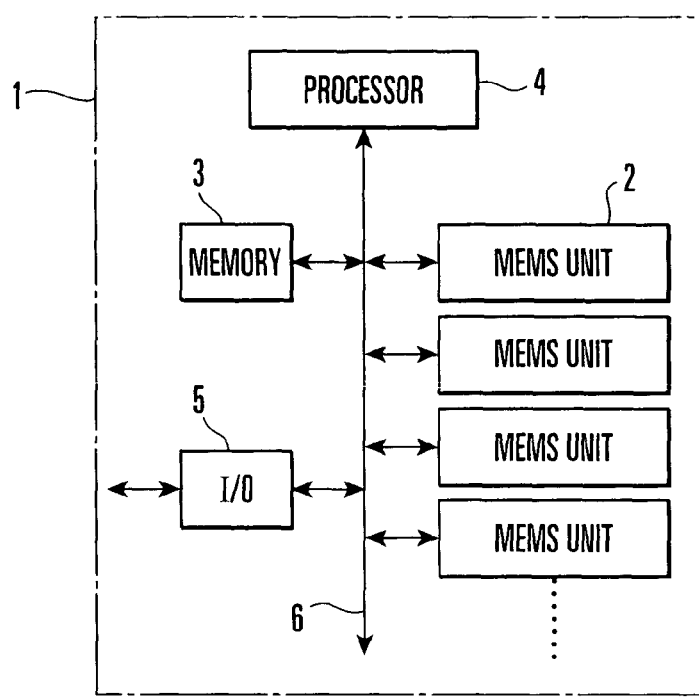
FIG. 1 is a block diagram showing an arrangement example of a semiconductor device having a MEMS according to the first embodiment of the present invention.

The first embodiment of the present invention will be described. FIG. 1 shows an arrangement example of a semiconductor device having a MEMS according to the first embodiment of the present invention. The device shown in FIG. 1 is constituted by forming on a semiconductor substrate 1 a system having MEMS units 2, a memory 3, a processor 4, and an I/O 5. The MEMS unit 2 can convert an electrical signal into physical motion of a MEMS structure, and converts physical motion of the MEMS structure into an electrical signal. The memory 3 stores a control program and data necessary to control the whole system. The processor 4 controls the whole system in accordance with the control program and data stored in the memory 3. The processor 4 transmits control data to the MEMS unit 2, and receives operation data from the MEMS unit 2. The I/O 5 exchanges data with an external device (not shown) which sets the operation of the system.

The MEMS unit 2, memory 3, processor 4, and I/O 5 are connected to each other by a data bus 6 which is formed on the semiconductor substrate 1. The data bus 6 transfers a control program, control data, control data to the MEMS unit 2, and operation data from the MEMS unit 2.

Figure 2:
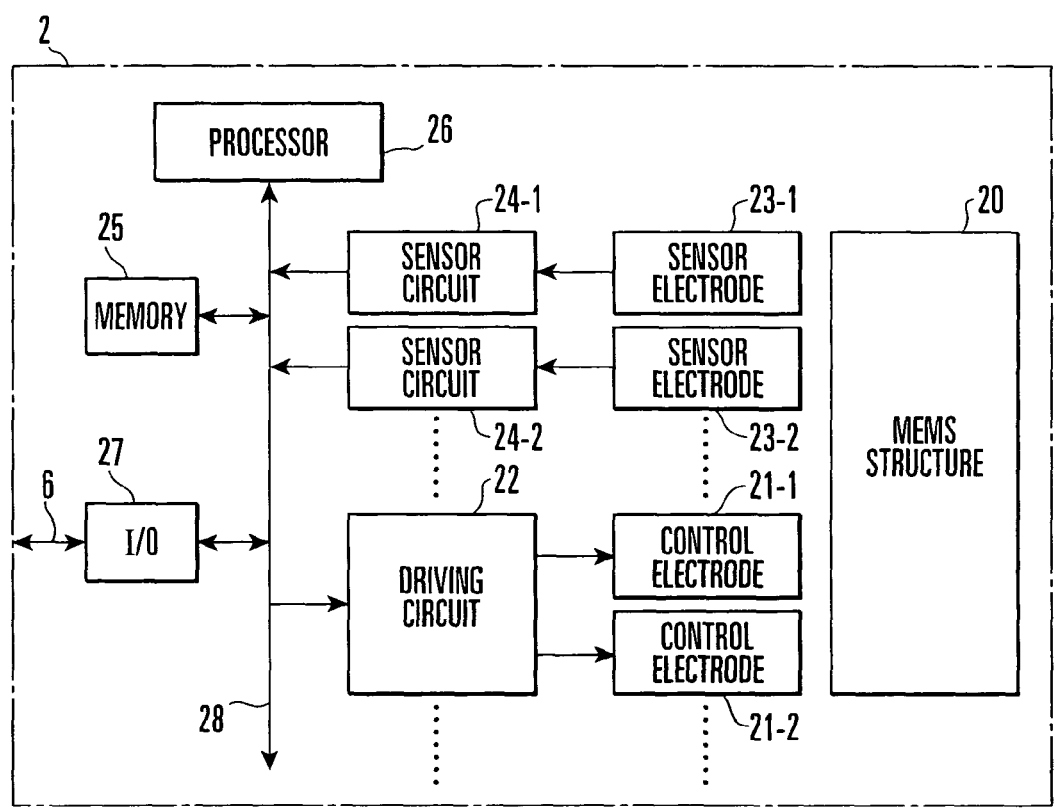
FIG. 2 is a block diagram showing part of the arrangement in FIG. 1.

FIG. 2 shows an arrangement example of the MEMS unit 2 shown in FIG. 1. The MEMS unit 2 comprises a MEMS structure 20 which is formed by micropatterning. The MEMS structure 20 is a structure having movable portions such as a switch and a mirror to be described later. The movable portion moves by an electrical signal supplied to the control electrode 21. The MEMS unit 2 comprises a control electrode 21 (21-1 and 21-2) which supplies a control signal (generally a voltage of several ten V to several hundred V) to the MEMS structure 20, and a driving circuit 22 which generates a control signal corresponding to control data transmitted from a processor 26 of the MEMS unit 2 and outputs the control signal to the control electrode 21. The MEMS unit 2 also comprises a sensor electrode 23 (23-1 and 23-2) for detecting physical motion of the MEMS structure 20, and a sensor circuit 24 (24-1 and 24-2) which generates operation data corresponding to physical motion of the MEMS structure 20 on the basis of the signal from the sensor electrode 23. The MEMS unit 2 further comprises a memory 25 which stores a control program and data necessary for the control of the MEMS unit 2, and the processor 26 which controls the entire MEMS unit in accordance with the control program and data stored in the memory 25, and calculates control data to be transmitted to the driving circuit 22 and operation data to be transmitted to the processor 4 on the basis of control data transmitted from the processor 4 and operation data of the MEMS structure 20 transmitted from the sensor circuit 24. The MEMS unit 2 still further comprises an I/O 27 which exchanges data with the processor 4 via the data bus 6 shown in FIG. 1, and a data bus 28 which connects the driving circuit 22, sensor circuit 24, memory 25, processor 26, and I/O 27 and transfers a control program, data necessary for control, operation data, and control data.

Figure 3:
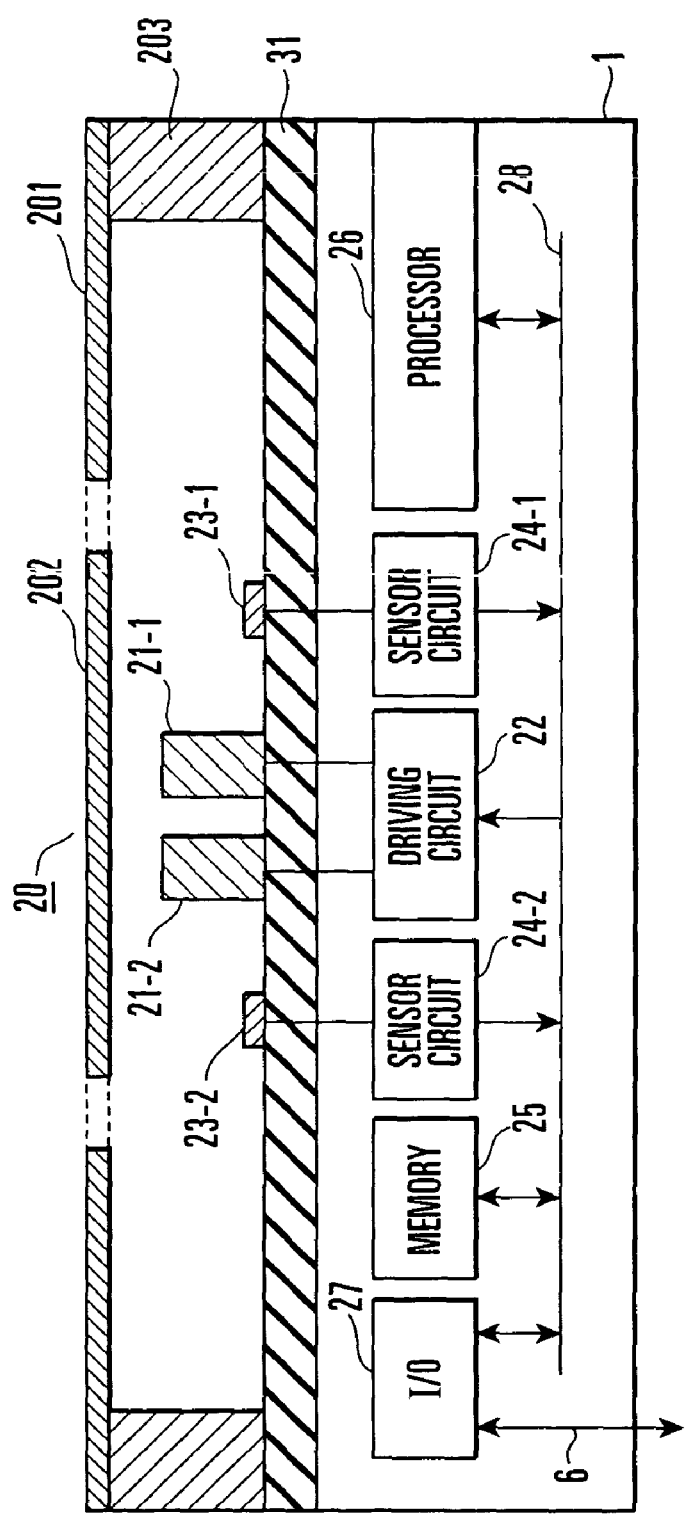
FIG. 3 is a schematic sectional view showing part of the arrangement in FIG. 1.

FIG. 3 shows an arrangement example of the MEMS unit 2. FIG. 3 illustrates a case wherein the MEMS structure 20 is a MEMS mirror, i.e., the MEMS unit 2 is a MEMS mirror unit. The MEMS structure 20 in FIG. 3 is constituted by a mirror substrate 201 which is formed from a conductive material, a mirror 202 which is formed in each of a plurality of openings of the mirror substrate 201, and pivotally coupled and electrically connected to the mirror substrate 201 via a coupling portion, and a support member 203 which supports the mirror substrate 201 so as to arrange the mirrors 202 above the control electrode 21 and sensor electrode 23 at an interval. The mirror 202 is pivotally coupled to the mirror substrate 201 via a coupling portion (broken portion in FIG. 3) which functions like a torsion spring. The mirror substrate 201 is supported by the support member 203 so as to space the mirror substrate 201 apart from the underlying control electrode 21, sensor electrode 23, and the like and form a predetermined gap.

The mirror 202 is arranged in the opening region of the mirror substrate 201. Although not shown, a movable frame is interposed between the mirror 202 and the mirror substrate 201. The mirror 202 is coupled to the movable frame via the mirror coupling portion, and pivotally supported by the mirror coupling portion. The mirror coupling portion is a spring member such as a torsion spring. A pair of mirror coupling portions are arranged on the two sides of the mirror 202 while sandwiching the center of the mirror 202. The movable frame is coupled to the mirror substrate 201 via frame coupling portions, and pivotally supported by the frame coupling portions. With this arrangement, an axis which passes through the pair of frame coupling portions and is parallel to the mirror substrate 201 functions as a pivot axis, and the movable frame is pivotal. The mirror 202 is coupled to the movable frame via the mirror coupling portions, and pivotally supported by the mirror coupling portions. The mirror 202 can pivot on, as a pivot axis, an axis which passes through the pair of mirror coupling portions and is parallel to the movable frame. The mirror 202 can, therefore, pivot on, as pivot axes, the two axes, i.e., the axis which passes through the pair of frame coupling portions and the axis which passes through the pair of mirror coupling portions. The MEMS structure 20 shown in FIG. 3 is an optical switching device.

The MEMS structure 20 is formed on the semiconductor substrate 1 via an interlayer dielectric film 31. An integrated circuit is formed on the semiconductor substrate 1 below the interlayer dielectric film 31. Part of the integrated circuit constitutes the driving circuit 22, sensor circuits 24-1 and 24-2, memory 25, processor 26, I/O 27, and data bus 28.

Figure 4A:
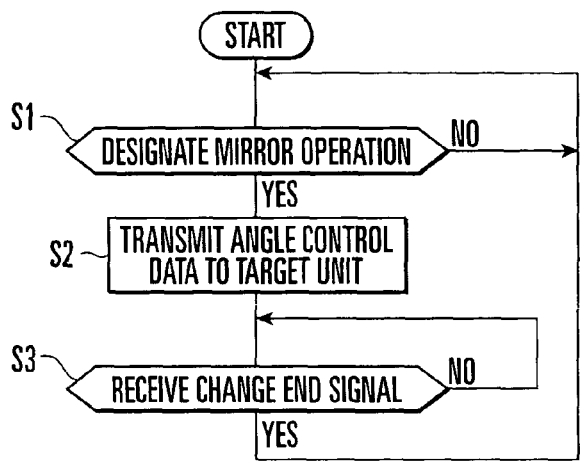
FIG. 4A is a flow chart showing an operation example of a processor 4 in FIG. 1.
Figure 4B:
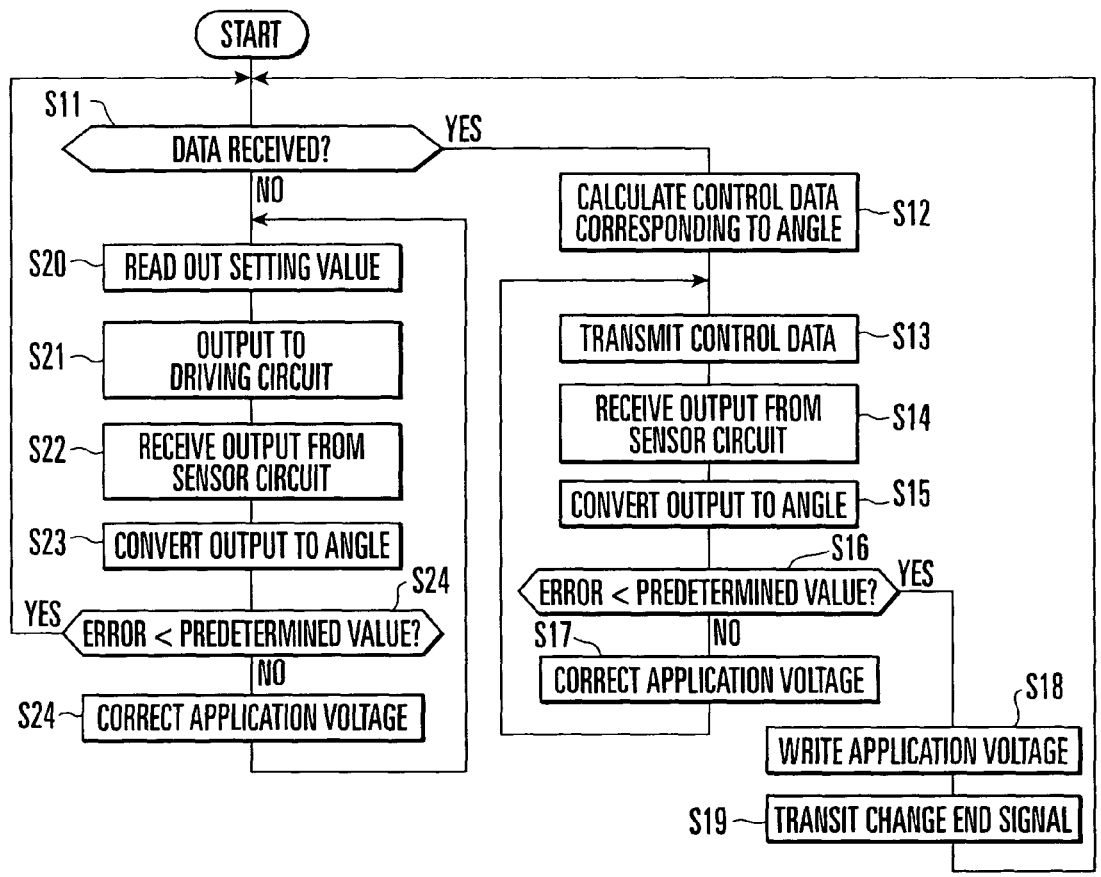
FIG. 4B is a flow chart showing an operation example of a processor 26 in FIG. 2.

The operation of the semiconductor device having the MEMS according to the first embodiment will be described with reference to the flow charts of FIGS. 4A and 4B by exemplifying a case wherein the MEMS unit 2 is a MEMS mirror unit. The processor 4 shown in FIG. 1 receives the angle setting value of the mirror 202 of the MEMS unit 2 to be controlled from an external device via the I/O 5 (step S1), and then transmits angle control data representing the received setting value via the data bus 6 to the MEMS unit 2 to be controlled (step S2). After transmission, the processor 4 waits for a response from the processor 26 (step S3).

The processor 26 of the MEMS unit 2 receives the angle control data from the processor 4 via the I/O 27 and data bus 28 (step S11), and then calculates control data in accordance with a predetermined algorithm of a control program stored in the memory 25 (step S12). In this calculation, the processor 26 calculates the value of an application voltage to the control electrodes 21-1 and 21-2 in order to pivot the mirror 202 by an angle represented by the received angle control data. After that, the processor 26 transmits voltage control data having the calculated voltage value to the driving circuit 22 via the data bus 28 (step S13).

Under the control of the processor 26, the driving circuit 22 generates a control signal (control voltage) corresponding to the voltage control data, and supplies it to the control electrodes 21-1 and 21-2. The mirror 202 receives a predetermined voltage from the driving circuit 22 via the support member 203 and mirror substrate 201. When the control voltage is applied to the control electrodes 21-1 and 21-2, an electrostatic force is generated between the mirror 202 and the control electrodes 21-1 and 21-2.

For example, when an angle setting value for pivoting the mirror 202 clockwise by a predetermined angle is set, the processor 26 applies a voltage to the control electrode 21-1 via the driving circuit 22. As a result, an electrostatic force is generated between the mirror 202 and the control electrode 21-1. The right side of the mirror 202 shown in FIG. 3 receives a downward force, and the mirror 202 pivots clockwise by an angle corresponding to the generated electrostatic force.

When the mirror 202 pivots clockwise, the distance between the mirror 202 and the sensor electrode 23-1 shortens, and the electrostatic capacitance formed between the mirror 202 and the sensor electrode 23-1 increases. To the contrary, the distance between the mirror 202 and the sensor electrode 23-2 increases, and the electrostatic capacitance formed between the mirror 202 and the sensor electrode 23-2 decreases.

The sensor circuit 24-1 is electrically connected to the sensor electrode 23-1, and electrically connected to the mirror 202 via the support member 203 and mirror substrate 201. By detecting the electrostatic capacitance between the mirror 202 and the sensor electrode 23-1, the distance between the mirror 202 and the sensor electrode 23-1 is detected, and operation data (distance data) representing the detected distance is transmitted to the processor 26 via the data bus 28.

Similarly, the sensor circuit 24-2 is electrically connected to the sensor electrode 23-2, and electrically connected to the mirror 202 via the support member 203 and mirror substrate 201. By detecting the electrostatic capacitance between the mirror 202 and the sensor electrode 23-2, the distance between the mirror 202 and the sensor electrode 23-2 is detected, and operation data representing the distance between the mirror 202 and the sensor electrode 23-2 is transmitted to the processor 26.

Accordingly, the processor 26 receives operation data from the sensor circuits 24-1 and 24-2 (step S14), and calculates the rotation angle of the mirror 202 on the basis of the received operation data (step S15). The processor 26 transmits operation data (angle data) representing the rotation angle to the processor 4 via the data bus 28 and I/O 27, and compares the angle setting value set by the processor 4 and the calculated rotation angle (step S16). Comparison by the processor 26 may be executed based on the angle control data received in step S11.

If the angle setting value and the rotation angle of the mirror 202 coincide with each other within a predetermined error range as a result of comparison, the processor 26 maintains the output voltage control data. If the angle setting value and the rotation angle of the mirror 202 do not coincide with each other, the processor 26 calculates and corrects the value of an application voltage to the control electrodes 21-1 and 21-2 in order to make the angle setting value and the rotation angle of the mirror 202 coincide with each other (step S17). The processor 26 transmits voltage control data having the calculated voltage value to the driving circuit 22 (step S13). In this way, the MEMS structure 20 can be controlled.

If Y in step S16, the processor 26 stores the voltage control data (application voltage) in the memory 25 (step S18), and notifies the processor 4 that the change has ended (step S19).

The processor 26 keeps maintaining and controlling the rotation angle of the mirror 202 in steps S20 to S24 until angle control data is received (step S11). In maintenance/control, the processor 26 reads out voltage control data stored in the memory 25 in step S20, and outputs the voltage control data read out in step S21 to the driving circuit 22. The processor 26 receives operation data from the sensor circuit in step S22, calculates the rotation angle of the mirror 202 on the basis of the operation data received in step S23, and compares the set angle setting value and the calculated rotation angle in step S24. If the angle setting value and the rotation angle of the mirror 202 coincide with each other within a predetermined error range as a result of comparison, the processor 26 maintains the output voltage control data. If the angle setting value and the rotation angle of the mirror 202 do not coincide with each other, the processor 26 advances to step S25 to correct voltage control data (application voltage).

Figure 5:
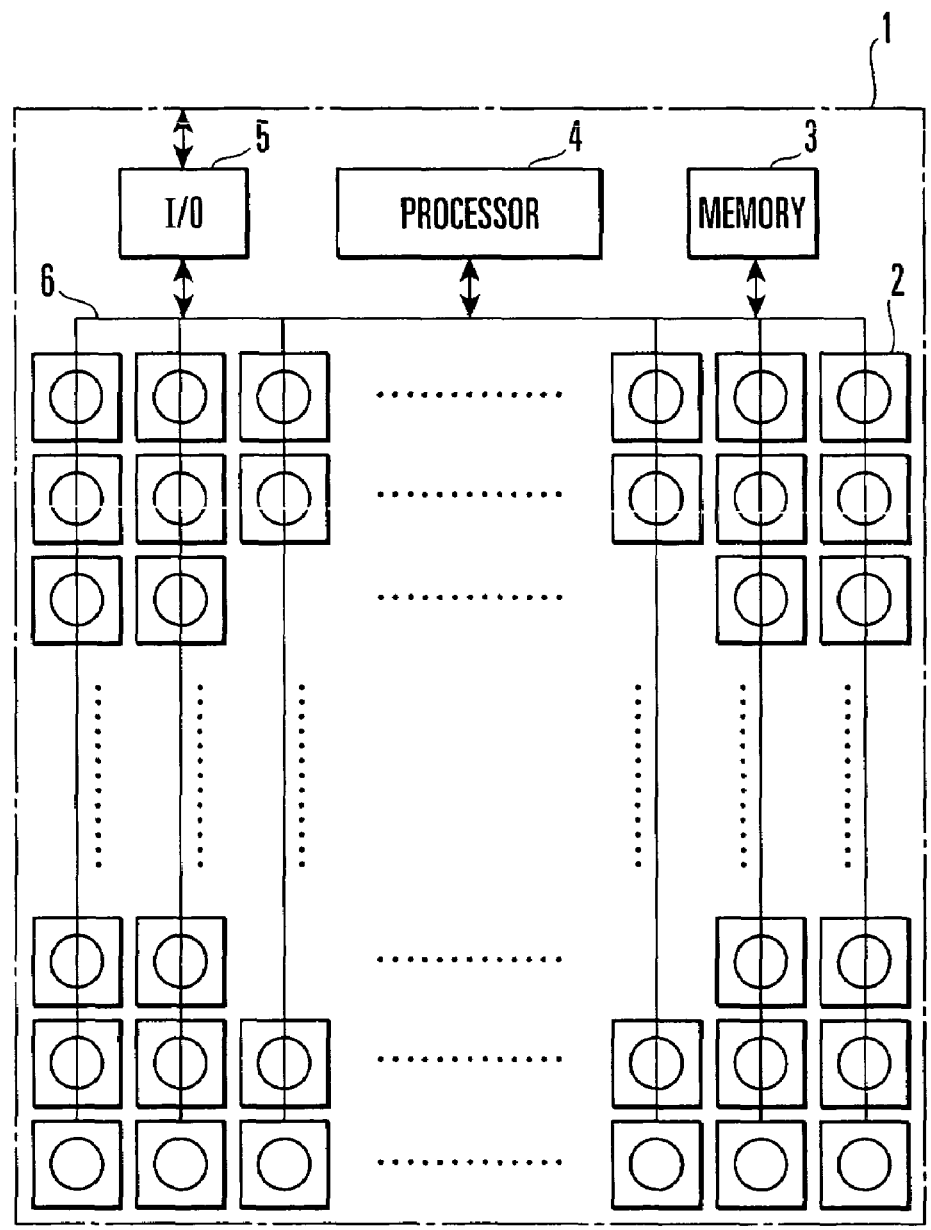
FIG. 5 is a plan view showing an arrangement example of the semiconductor device having the MEMS in FIG. 1.

FIG. 5 shows an arrangement example of the semiconductor device having the MEMS in FIG. 1. FIG. 5 illustrates a case wherein the MEMS unit 2 is a MEMS mirror unit. In this case, MEMS units 2 shown in FIG. 3 are arrayed in a matrix. The MEMS units 2, memory 3, processor 4, and I/O 5 are arranged on the single semiconductor substrate 1, and connected via the data bus 6.

Figure 20:
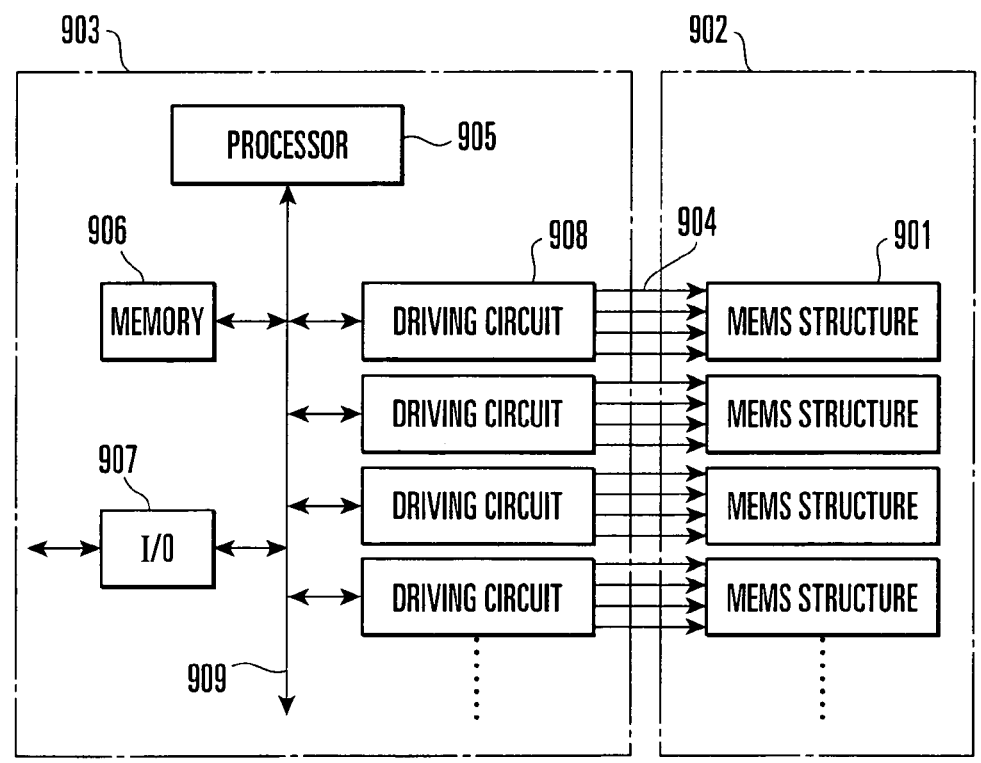
FIG. 20 is a block diagram showing an arrangement example of a conventional MEMS.

As described above, according to the first embodiment, the MEMS structure 20 is controlled on the basis of operation data from the sensor circuit 24, realizing higher-precision control. The control part can be downsized using the MEMS unit 2 in which the MEMS structure 20 and the control part (control electrode 21, driving circuit 22, sensor electrode 23, sensor circuit 24, memory 25, processor 26, I/O 27, and data bus 28) are integrally formed on the single semiconductor substrate 1. The conventional device shown in FIG. 20 requires many control signal lines between an electronic component and a control device. In the first embodiment, the MEMS structure 20 and control part are formed on a single chip (semiconductor device), so that the number of signal lines for connecting a semiconductor chip and external device can be greatly reduced in comparison with the conventional device. Consequently, the first embodiment can greatly downsize the MEMS. In general, the electrostatic capacitance detected by the sensor electrode is very small, and it is difficult owing to the influence of the parasitic capacitance of the signal line to accurately measure the capacitance when the sensor circuit is not integrated. To the contrary, the first embodiment can achieve precise measurement while suppressing the influence of the parasitic capacitance of the signal line by integrating the sensor circuit, and realize high-precision motion control of a small movable portion such as a mirror.

The first embodiment has exemplified an optical switching device having a mirror as a small movable portion, as shown in FIG. 3, but an application of the present invention is not limited to this. For example, a semiconductor device having a MEMS according to the present invention can also be applied to a variable directivity array antenna constituted by replacing a mirror portion with a small antenna.

Second Embodiment

Figure 6:
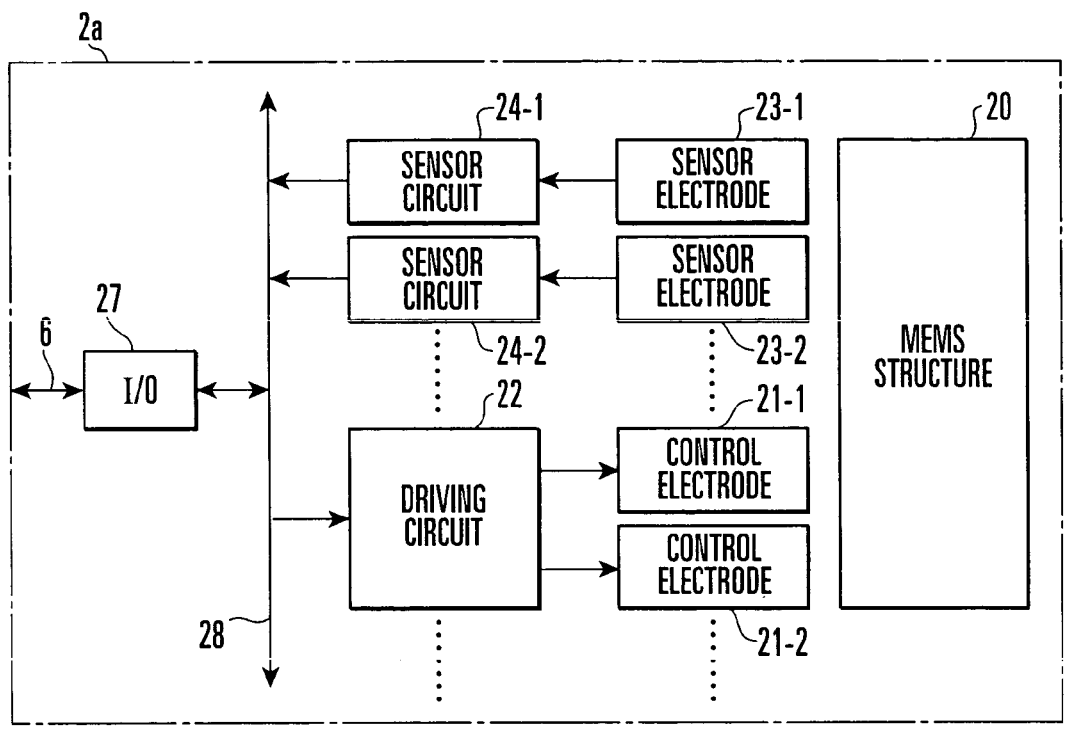
FIG. 6 is a block diagram showing an arrangement example of a semiconductor device having a MEMS according to the second embodiment of the present invention.

The second embodiment of the present invention will be described. Also in the second embodiment, the arrangement of an entire semiconductor device having a MEMS is the same as that in the first embodiment, and the same reference numerals as in FIG. 1 denote the same parts. FIG. 6 shows the arrangement of a MEMS unit according to the second embodiment. This MEMS unit is different from that in FIG. 2 in that the MEMS unit does not include any processor and memory.

Figure 7:
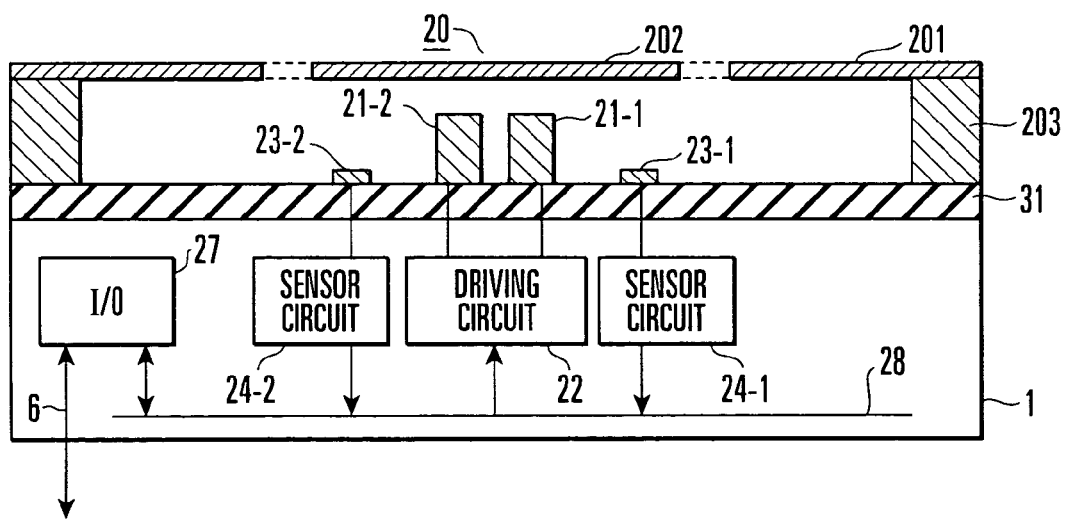
FIG. 7 is a schematic sectional view showing part of the arrangement in FIG. 6.

A MEMS unit 2a according to the second embodiment is comprised of the following parts:

1. a MEMS structure 20 which is formed by micropatterning;
2. a control electrode 21 (21-1 and 21-2) which supplies a control signal (generally a voltage of several ten V to several hundred V) to the MEMS structure 20;
3. a driving circuit 22 which generates a control signal corresponding to control data transmitted from outside the MEMS unit 2a and outputs the control signal to the control electrode 21;
4. a sensor electrode 23 (23-1 and 23-2) for detecting physical motion of the MEMS structure 20;
5. a sensor circuit 24 (24-1 and 24-2) which generates operation data corresponding to physical motion of the MEMS structure 20 on the basis of the signal of the sensor electrode 23, and transmits the operation data outside the MEMS unit 2a;
6. an I/O 27 which exchanges data with a processor 4 via a data bus 6; and
7. a data bus 28 which connects the driving circuit 22, sensor circuit 24, and I/O 27 and transfers operation data and control data FIG. 7 shows an arrangement example of the MEMS unit 2a. FIG. 7 illustrates a case wherein the MEMS structure 20 is a MEMS mirror, i.e., the MEMS unit 2a is a MEMS mirror unit. The arrangement of the MEMS unit 2a shown in FIG. 7 is the same as that in FIG. 3 except that the unit does not include any processor and memory.

An operation example of a semiconductor device having a MEMS according to the present invention will be described by exemplifying a case wherein the MEMS unit 2a is a MEMS mirror unit. The processor 4 receives the angle setting value of a mirror 202 of the MEMS unit 2a to be controlled from an external device via an I/O 5, and calculates control data in accordance with a predetermined algorithm of a control program stored in a memory 3. That is, the processor 4 calculates the value of an application voltage to the control electrodes 21-1 and 21-2 of the MEMS unit 2a so as to pivot the mirror 202 by an angle represented by the received angle setting value. The processor 4 transmits voltage control data having the calculated voltage value via the data bus 6 to the MEMS unit 2a to be controlled.

The driving circuit 22 of the MEMS unit 2a receives the voltage control data via the I/O 27 and data bus 28, generates a control signal (control voltage) corresponding to the voltage control data, and supplies it to the control electrodes 21-1 and 21-2. As described in the first embodiment, when the control voltage is applied to the control electrodes 21-1 and 21-2, an electrostatic force is generated between the mirror 202 and the control electrodes 21-1 and 21-2, and the mirror 202 pivots by an angle corresponding to the generated electrostatic force. The operation of the sensor circuits 24-1 and 24-2 is the same as that in the first embodiment.

The processor 4 calculates the rotation angle of the mirror 202 on the basis of the operation data received from the sensor circuits 24-1 and 24-2 of the MEMS unit 2a, and compares the angle setting value set by the external device and the calculated rotation angle. If the angle setting value and the rotation angle of the mirror 202 coincide with each other as a result of comparison, the processor 4 maintains the output voltage control data. If the angle setting value and the rotation angle of the mirror 202 do not coincide with each other, the processor 4 calculates the value of an application voltage to the control electrodes 21-1 and 21-2 so as to make the angle setting value and the rotation angle of the mirror 202 coincide with each other. The processor 4 transmits voltage control data having the calculated voltage value to the MEMS unit 2a. In this fashion, the MEMS structure 20 can be controlled. The second embodiment can also constitute a semiconductor device having a MEMS as shown in FIG. 5 by using the MEMS unit 2a shown in FIG. 7.

As described above, the second embodiment can realize higher-precision control because the MEMS structure 20 is controlled on the basis of operation data from the sensor circuit 24. The control part can be downsized using the MEMS unit 2a in which the MEMS structure 20 and the control part (control electrode 21, driving circuit 22, sensor electrode 23, sensor circuit 24, I/O 27, and data bus 28) are integrally formed on a single substrate. In addition, the number of signal lines externally connected to the MEMS can be greatly reduced in comparison with the conventional device, greatly downsizing the MEMS. In general, the electrostatic capacitance detected by the sensor electrode is very small, and it is difficult owing to the influence of the parasitic capacitance of the signal line to accurately measure the capacitance when the sensor circuit is not integrated. However, the second embodiment can achieve precise measurement while suppressing the influence of the parasitic capacitance of the signal line by integrating the sensor circuit, and realize high-precision mirror control.

Third Embodiment

Figure 8:
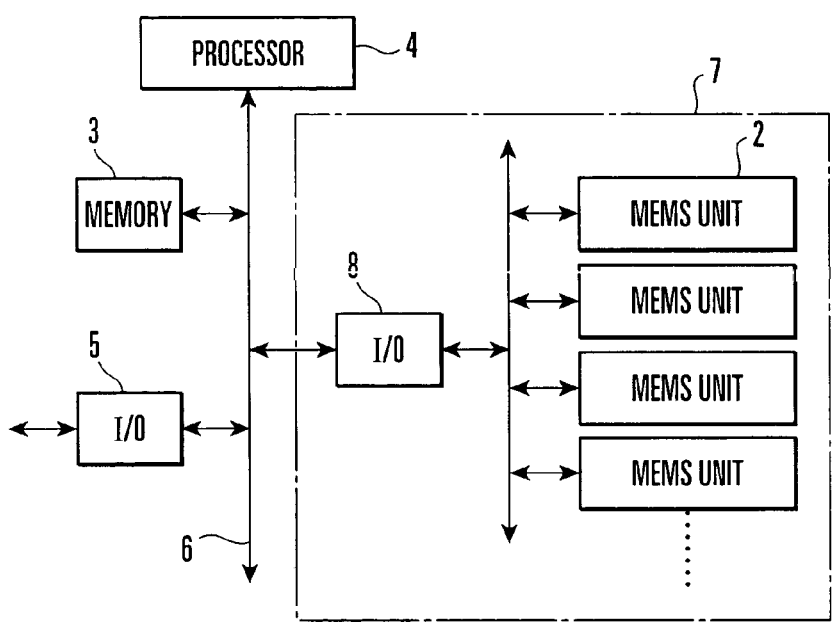
FIG. 8 is a block diagram showing an arrangement example of a semiconductor device having a MEMS according to the third embodiment of the present invention.

The third embodiment of the present invention will be described. FIG. 8 shows the arrangement of a semiconductor device having a MEMS according to the third embodiment of the present invention. The third embodiment comprises a semiconductor device 7 having a MEMS, a memory 3 which stores a control program and data necessary to control the system, a processor 4 which controls the whole system in accordance with the control program and data stored in the memory 3, transmits control data to the semiconductor device 7 having a MEMS, and receives operation data from the semiconductor device 7 having a MEMS, an I/O 5 which exchanges data with an external device (not shown) for setting the operation of the system, and a data bus 6 which connects the semiconductor device 7 having a MEMS, memory 3, processor 4, and I/O 5, and transfers a control program, control data, control data to the semiconductor device 7 having a MEMS, and operation data from the semiconductor device 7 having a MEMS.

The semiconductor device 7 having a MEMS is constituted by forming on a single substrate at least one MEMS unit 2 which can convert an electrical signal into physical motion of a MEMS structure and convert physical motion of the MEMS structure into an electrical signal, and an I/O 8 for transmitting control data from the processor 4 to the MEMS unit 2 and transmitting operation data from the MEMS unit 2 to the processor 4.

The memory 3, processor 4, and I/O 5 are formed on a semiconductor chip different from the semiconductor device 7 having a MEMS, and mounted on a printed board together with the semiconductor device 7 having a MEMS. At this time, the memory 3, processor 4, and I/O 5 may be formed on a single semiconductor chip or different semiconductor chips. The MEMS unit 2 may be directly connected to the data bus 6 without mounting the I/O 8 on the semiconductor device 7 having a MEMS.

The MEMS unit 2 is used in FIG. 8, but the third embodiment can be implemented by either the MEMS unit 2 shown in FIG. 2 or the MEMS unit 2a shown in FIG. 6. When the MEMS structure 20 is a MEMS mirror, the third embodiment can be implemented by the MEMS mirror unit shown in FIG. 3 or 7. The operation of this system is the same as that in the first embodiment in the use of the MEMS unit 2, and that in the second embodiment in the use of the MEMS unit 2a.

Figure 9:
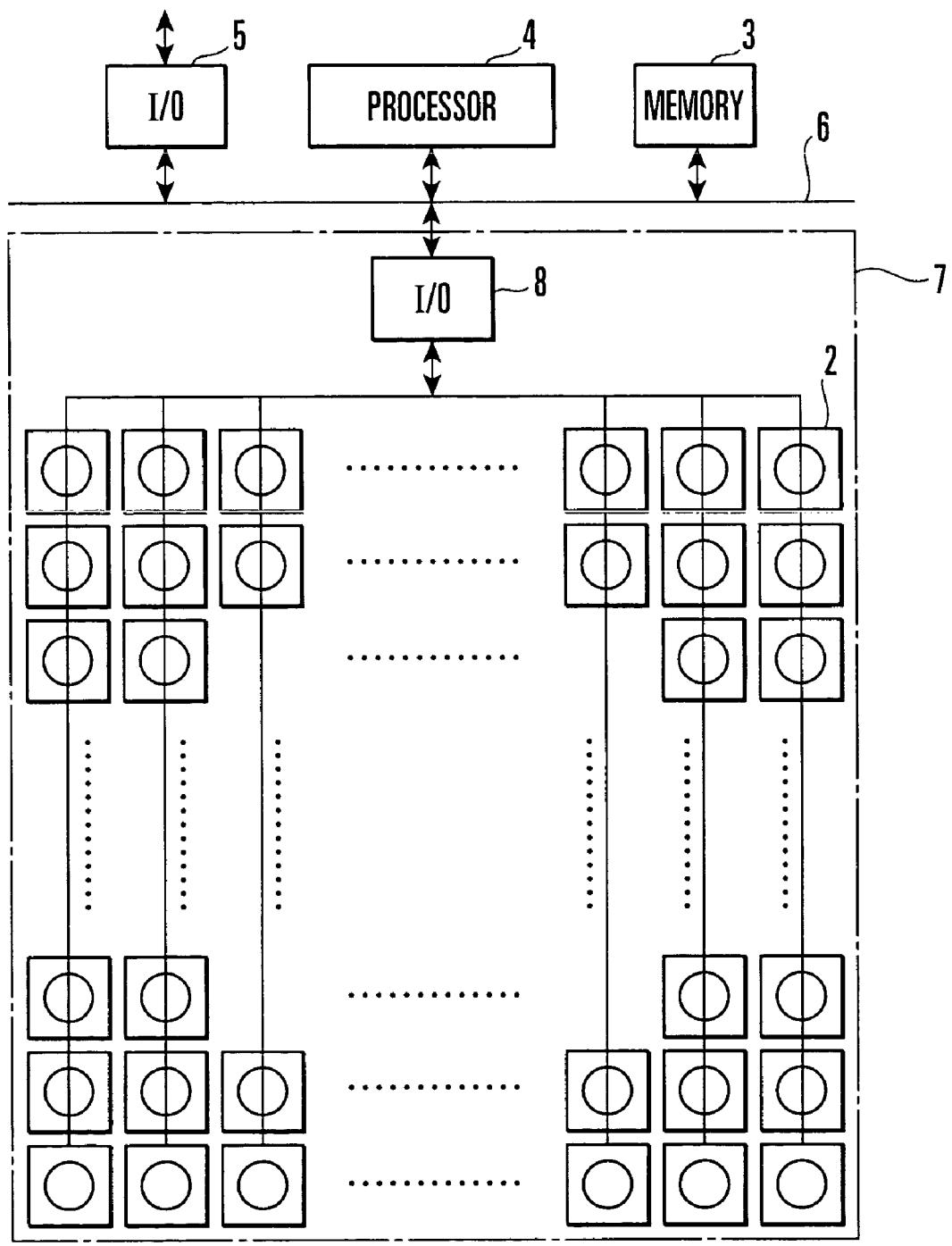
FIG. 9 is a plan view showing the arrangement example of the semiconductor device having the MEMS according to the third embodiment of the present invention.

FIG. 9 shows an arrangement example of the system in FIG. 8. FIG. 9 illustrates a case wherein the MEMS unit 2 (or 2a) is a MEMS mirror unit. In this case, the semiconductor device 7 having a MEMS constituted by arraying a plurality of MEMS mirror units 2 (or 2a) shown in FIG. 3 (or FIG. 7) in a matrix on a single substrate, and the memory 3, processor 4, and I/O 5 which are formed on a chip different from the semiconductor device 7 having a MEMS are mounted on, e.g., a printed board. The semiconductor device 7 having a MEMS, memory 3, processor 4, and I/O 5 are connected via the data bus 6 on the printed board.

As described above, according to the third embodiment, the MEMS structure 20 is controlled on the basis of operation data from the sensor circuit 24, realizing higher-precision control. The memory 3, processor 4, and I/O 5 are formed on a chip different from the semiconductor device 7 having a MEMS, and thus the semiconductor device 7 having a MEMS can be downsized.

With the use of the MEMS unit constituted by integrating the MEMS structure and control part, the first to third embodiments can provide a very compact semiconductor device. Further, higher-precision control can be realized because the MEMS structure is controlled on the basis of the second electrical signal corresponding to physical motion of the MEMS structure.

Fourth Embodiment

Figure 10:
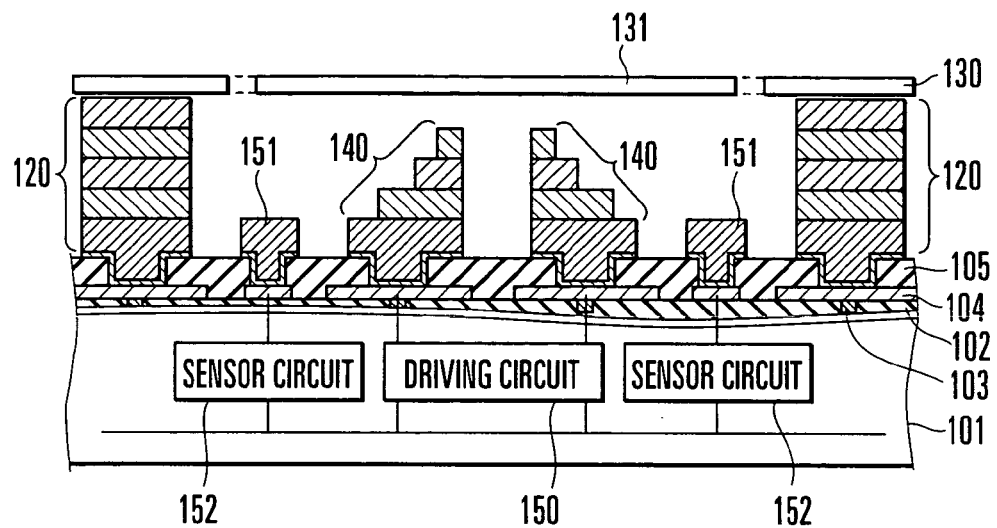
FIG. 10 is a sectional view showing part of an arrangement example of a semiconductor device having a MEMS according to the fourth embodiment of the present invention.
Figure 11:
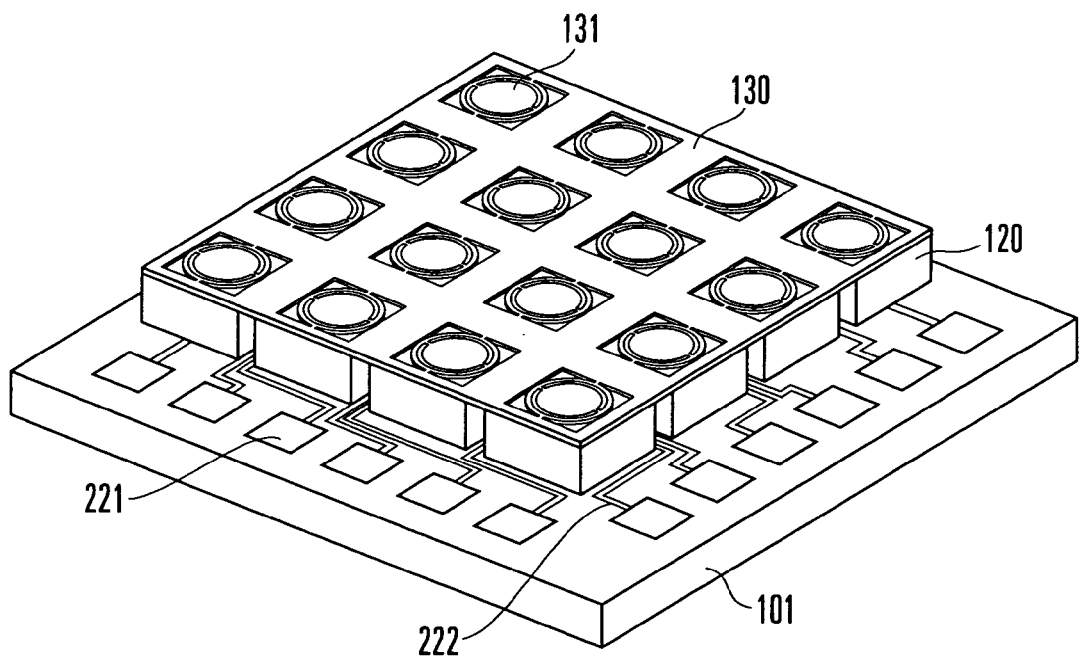
FIG. 11 is a perspective view showing the arrangement example of the semiconductor device having the MEMS according to the fourth embodiment of the present invention.

The fourth embodiment of the present invention will be described. FIG. 10 shows an optical switching device as an arrangement example of a semiconductor device having a plurality of MEMS units. FIG. 11 shows the schematic arrangement of the optical switching device in FIG. 10. FIG. 10 mainly illustrates a portion (mirror element) formed from one mirror as one building unit of the optical switching device. The mirror element corresponds to one MEMS unit. For example, at least a driving circuit 150 and sensor circuit 152 are formed on a semiconductor substrate 101 of, e.g., silicon. Interlayer dielectric layers 102 and 105 and an interconnection layer 104 are formed on the semiconductor substrate 101.

An integrated circuit is formed below the interlayer dielectric layer 102 of the semiconductor substrate 101, and part of the integrated circuit forms the driving circuit 150 and sensor circuits 152. In addition to the driving circuit 150 and sensor circuits 152, a memory, processor, and I/O (none of them are shown) are arranged as part of the integrated circuit, similar to the semiconductor device having a MEMS and the MEMS unit 2 shown in FIGS. 1, 2, and 3.

A connection electrode 103, the interconnection layer 104, the interlayer dielectric layer 105, support members 120, a mirror substrate 130, a mirror 131, control electrodes 140, and sensor electrodes 151 are arranged on the interlayer dielectric layer 102 having the underlying integrated circuit.

The support member 120 is selectively formed on the semiconductor substrate 101 via the interlayer dielectric layer 105. The support member 120 is conductive, and is electrically connected to the interconnection layer 104 via a through hole formed in the interlayer dielectric layer 105. The support member 120 receives a predetermined potential (e.g., ground potential) via the connection electrode 103 formed in the interlayer dielectric layer 102.

The mirror substrate 130 is supported apart from this upper surface of the interlayer dielectric layer 105 by the support members 120. The mirror substrate 130 is conductive, is electrically connected to the support members 120, and has an opening region where the mirror 131 is arranged. As shown in the perspective view of FIG. 11, mirrors 131 are arranged in a plurality of opening regions of the mirror substrate 130, and one mirror 131 forms one mirror element (MEMS unit).

Figure 12:
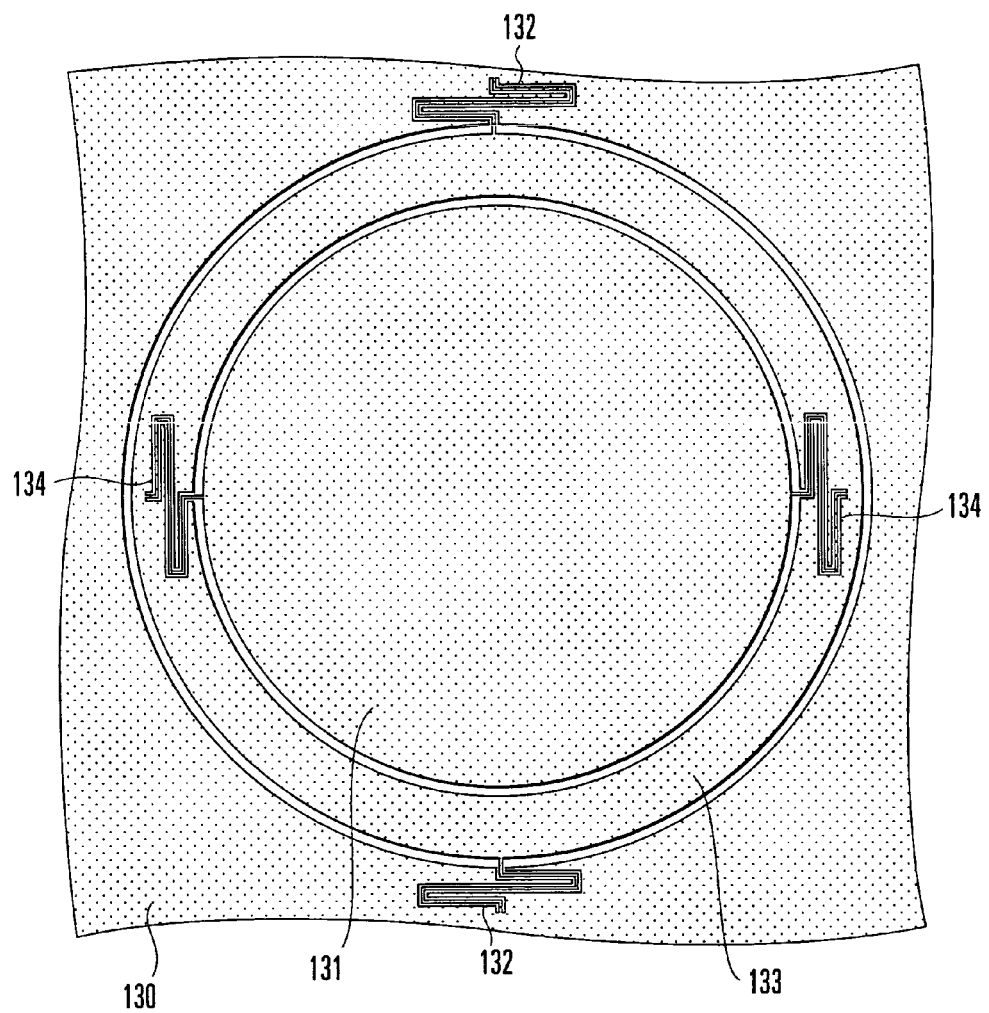
FIG. 12 is a plan view showing part of the arrangement example of the semiconductor device having the MEMS according to the fourth embodiment of the present invention.

FIG. 12 shows the mirror substrate 130. FIG. 12 illustrates a region centered on one mirror 131. A movable frame 133 and the mirror 131 are arranged in the opening region of the mirror substrate 130. The movable frame 133 is pivotally coupled to the mirror substrate 130 via a pair of frame coupling portions 132. The mirror 131 is pivotally coupled to the movable frame 133 via a pair of mirror coupling portions 134. Each coupling portion is formed from a spring member such as a torsion spring.

The movable frame 133 can pivot on, as a pivot axis, an axis (up-to-down direction in FIG. 12) which passes through the pair of frame coupling portions 132 and is parallel to the mirror substrate 130. The mirror 131 can pivot on, as a pivot axis, an axis (right-to-left direction in FIG. 12) which passes through the pair of mirror coupling portions 134 and is parallel to the movable frame 133. As a result, the mirror 131 can pivot on, as pivot axes, the two axes, i.e., the axis which passes through the pair of frame coupling portions 132 and the axis which passes through the pair of mirror coupling portions 134.

The mirror 131 is conductive, and is electrically connected to the mirror substrate 130 via the conductive coupling portions (frame coupling portions 132, mirror coupling portions 134, and movable frame 133). The mirror 131 receives a predetermined potential (e.g., ground potential) via the interconnection layer 104, support member 120, mirror substrate 130, and coupling portions.

The optical switching device shown in FIGS. 10 and 11 comprises a plurality of mirror elements which are arrayed (integrated) in a matrix. The control electrode 140 of each mirror element is connected to the driving circuit 150, and the sensor electrode 151 is connected to the sensor circuit 152. The sensor circuit 152 and driving circuit 150 are connected via a bus to an integrated circuit (not shown) such as a processor, and connected to, e.g., pad terminals 221 via I/Os and wiring lines 222. The pad terminals 221 are connected to an external system to achieve the function of the optical switching device serving as a MEMS system.

The sensor electrode 151 is arranged below the mirror 131 to detect the posture of the mirror 131. The sensor electrode 151 is selectively formed on the semiconductor substrate 101 via the interlayer dielectric layer 105, and arranged below the mirror 131 (except a portion immediately below the pivot axis of the mirror) at a predetermined distance from the mirror 131. At least one sensor electrode 151 is arranged on one side or each of two sides of one pivot axis for one mirror 131. The sensor electrode 151 is connected to the sensor circuit 152 formed on the semiconductor substrate 101 via a through hole formed in the interlayer dielectric layer 105, the connection electrode 103 formed in the interlayer dielectric layer 102, and the interconnection layer 104.

The sensor circuit 152 is an integrated circuit of an element and interconnection formed on the semiconductor substrate 101. The sensor circuit 152 detects the posture of the mirror 131, i.e., the rotation angle by detecting an electrostatic capacitance corresponding to the mirror 131 and the sensor electrode 151 that changes depending on the pivot angle of the mirror 131. A signal representing the pivot angle of the mirror 131 that is detected by the sensor circuit 152 is fed back to the driving circuit 150.

The control electrode 140 is arranged below the mirror 131 to control the posture of the mirror 131. The control electrode 140 is selectively formed on the semiconductor substrate 101 via the interlayer dielectric layer 105, and arranged below the mirror 131 (except a portion immediately below the pivot axis of the mirror) at a predetermined distance from the mirror 131. At least one control electrode 140 is arranged on one side or each of two sides of one pivot axis for one mirror 131. The control electrode 140 is connected to the driving circuit 150 formed on the semiconductor substrate 101 via a through hole formed in the interlayer dielectric layer 105, the connection electrode 103 formed in the interlayer dielectric layer 102, and the interconnection layer 104.

The driving circuit 150 is an integrated circuit of an element and interconnection formed on the semiconductor substrate 101. The driving circuit 150 recognizes the pivot angle of the mirror 131 from a signal fed back from the sensor circuit 152, and applies to the control electrode 140 a voltage for controlling the pivot state (pivot amount) of the mirror 131 so as to adjust the pivot angle of the mirror 131 detected by the sensor circuit 152 to a desired value (e.g., a value set by an external system).

When the driving circuit 150 applies a voltage to the control electrode 140 to generate a potential difference between the control electrode 140 and the mirror 131, charges are induced to a portion of the mirror 131 that faces the control electrode 140. The mirror 131 pivots by an electrostatic force (Coulomb force) which acts on the charges. The mirror 131 stops at a position where a torque around the pivot axis by the electrostatic force and an opposite torque generated at a torsion spring (coupling portion) balance with each other.

The driving circuit 150 and sensor circuit 152 may be arranged for one mirror element. Alternatively, one driving circuit 150 and one sensor circuit 152 can simultaneously desirably control a plurality of mirror elements. Their control operation is the same as operation control of each MEMS structure 20 of the semiconductor device having a MEMS shown in FIGS. 1, 2, and 3.

As described above, the optical switching device shown in FIGS. 10 and 11 according to the fourth embodiment can be downsized and exhibits high performance because the optical switching device is formed on a substrate integrally with an integrated circuit including a driving circuit and sensor circuit.

Figure 13A:
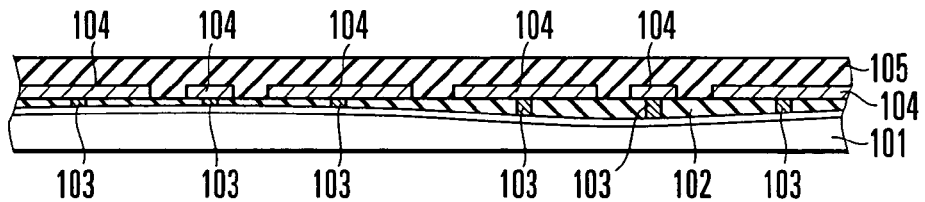
FIGS. 13A to 13O are sectional views showing an example of a method of manufacturing the semiconductor device having the MEMS according to the fourth embodiment of the present invention.

The manufacture of the optical switching device according to the fourth embodiment will be described. As shown in FIG. 13A, active circuits (not shown) which constitute the above-described driving circuit 150 and sensor circuit 152 are formed on a semiconductor substrate 101 of a semiconductor such as silicon, and then an interlayer dielectric layer 102 of silicon oxide is formed. A connection port is formed in the interlayer dielectric layer 102, and an interconnection layer 104 is formed and connected to a lower interconnection via the connection port and connection electrode 103.

This structure can be formed by known photolithography and etching. For example, the active circuits can be fabricated by a CMOS LSI process. The connection electrode 103 and interconnection layer 104 can be formed by forming and processing an Au/Ti metal film. The metal film is made up of a Ti lower layer about 0.1 μm thick and an Au upper layer about 0.3 μm thick.

The metal film is formed as follows. Au and Ti are formed on the silicon oxide film by sputtering or vapor deposition. The Au/Ti film is formed into a predetermined pattern by photolithography. At this time, an electrode interconnection, a connection portion for adhering a mirror substrate to be described later, and a resist pattern for forming a wire bonding pad are simultaneously formed. The Au/Ti film is selectively removed by wet etching using the resist pattern as a mask, and then the resist pattern is removed to form an interconnection layer 104. The interconnection layer 104 has the electrode interconnection, the connection portion for connecting a mirror substrate to be described later, and the wire bonding pad (not shown).

After these layers are formed, an interlayer dielectric layer 105 is formed to cover the interconnection layer 104. The interlayer dielectric layer 105 can be formed from a polyimide film prepared by applying polybenzoxazole serving as a photosensitive organic resin to a film thickness of several μm. The interlayer dielectric layer 105 may be formed from another insulating material.

Figure 13B:
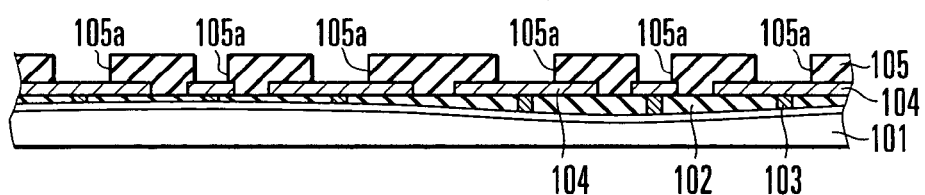

As shown in FIG. 13B, an opening 105a is formed in the interlayer dielectric layer 105 to expose a predetermined portion of the interconnection layer 104. When the interlayer dielectric layer 105 is formed from a photosensitive organic resin, as described above, a pattern is formed by exposure and developing so as to open the region of the opening 105a.

After the pattern is formed, the film is annealed and cured to form an interlayer dielectric layer 105 having the opening 105a.

Figure 13C:
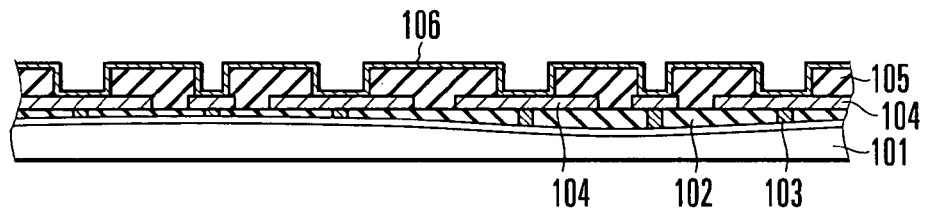

As shown in FIG. 13C, a seed layer 106 is formed to cover the interlayer dielectric layer 105 including the opening 105a. The seed layer 106 is, e.g., a Ti/Cu/Ti metal film, and both Ti and Cu film thicknesses are about 0.1 µm.

Figure 13D:
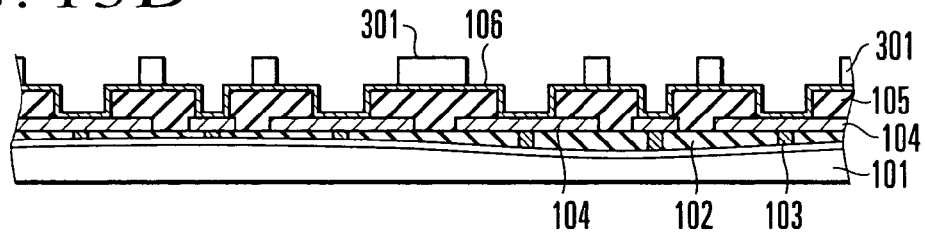

As shown in FIG. 13D, a sacrificial pattern 301 having a film thickness of about 17 µm at a flat portion is formed. The sacrificial pattern 301 can be formed by processing, e.g., a film of polybenzoxazole serving as a photosensitive organic resin by photolithography.

For example, a polyimide film formed by applying polybenzoxazole is expose and developed by a contact aligner using a photomask and a stepper using a reticle so as to open, by photolithography, portions where a control electrode pattern, a sensor electrode pattern, a connection portion for connecting a mirror substrate, and a wire bonding pad are to be formed. The photosensitive portion is dissolved in a developing solution, thereby forming a sacrificial pattern 301 having desired opening regions.

Figure 13E:
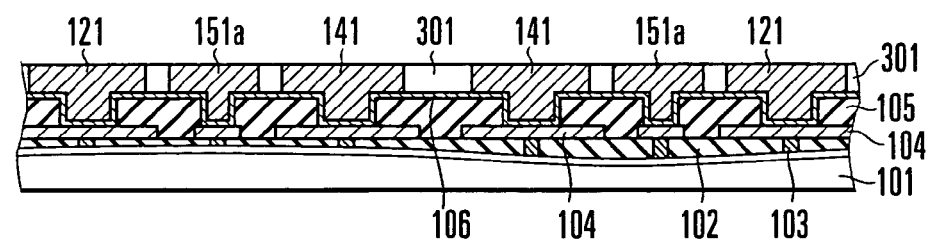

As shown in FIG. 13E, first, second, and third Cu metal patterns 121, 141, and 151a are formed by electroplating to the same thickness as that of the sacrificial pattern 301 on the seed layer 106 which is exposed in the opening portions of the first region (formation region of the support member 120), the second region (formation region of the control electrode 140), and the third region (formation region of the sensor electrode 151). At this time, the surfaces of the metal patterns 121, 141, and 151a and the sacrificial pattern 301 are made flat so as to be almost flush with each other.

Figure 13F:
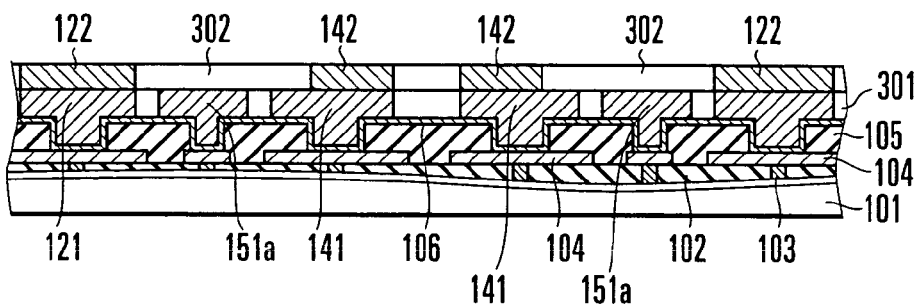

As shown in FIG. 13F, a sacrificial pattern 302 having a film thickness of about 17 µm at a flat portion is formed by the same process as described above. First and second Cu metal patterns 122 and 142 are formed by electroplating to the same thickness as that of the sacrificial pattern 302 on the first and second metal patterns 121 and 141 which are exposed in the openings of the sacrificial pattern 302. In this case, no opening is formed in the sacrificial pattern 302 above the third metal pattern 151a, and the third metal pattern 151a is covered with the sacrificial pattern 302. This is merely an example, and an opening may be formed in the sacrificial pattern 302 to further form a metal pattern.

Figure 13G:
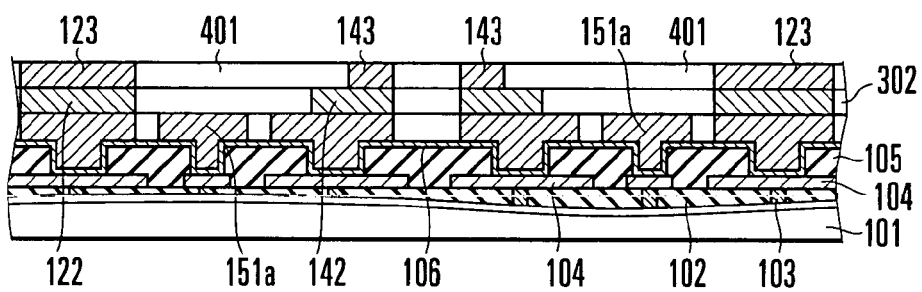

As shown in FIG. 13G, a sacrificial pattern 401 having a film thickness of about 17 µm at a flat portion is formed by the same process as described above. First and second Cu metal patterns 123 and 143 are formed by electroplating to the same thickness as that of the sacrificial pattern 401 on the first and second metal patterns 122 and 142 which are exposed in the openings of the sacrificial pattern 401.

Figure 13H:
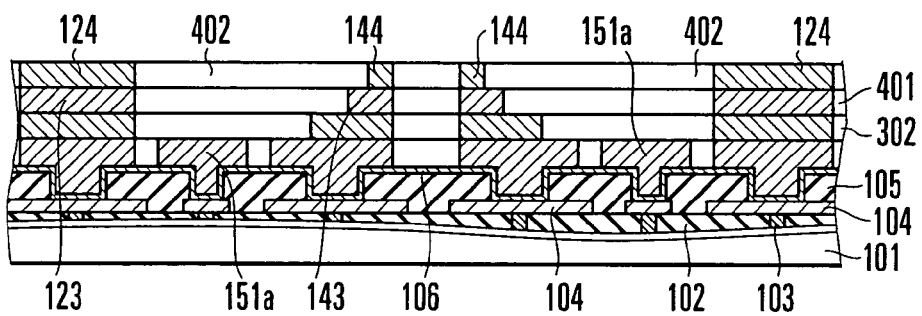

As shown in FIG. 13H, a sacrificial pattern 402 having a film thickness of about 17 µm at a flat portion is formed by the same process as described above. First and second Cu metal patterns 124 and 144 are formed by electroplating to the same thickness as that of the sacrificial pattern 402 on the first and second metal patterns 123 and 143 which are exposed in the openings of the sacrificial pattern 402.

Figure 13I:
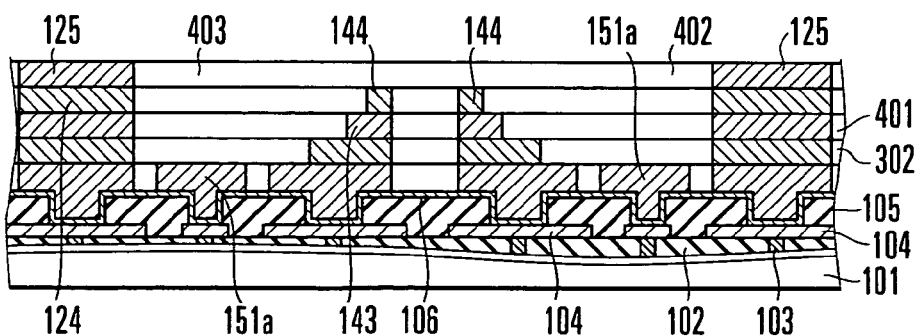

As shown in FIG. 13I, a sacrificial pattern 403 having a film thickness of about 17 µm at a flat portion is formed by the same process as described above. A fourth Cu metal pattern 125 is formed by electroplating to the same thickness as that of the sacrificial pattern 403 on the first metal pattern 124 which is exposed in the opening of the fourth region (region in the first region) of the sacrificial pattern 403. No opening is formed in the sacrificial pattern 403 above the second metal pattern 144, and the second metal pattern 144 is covered with the sacrificial pattern 403.

Figure 13J:
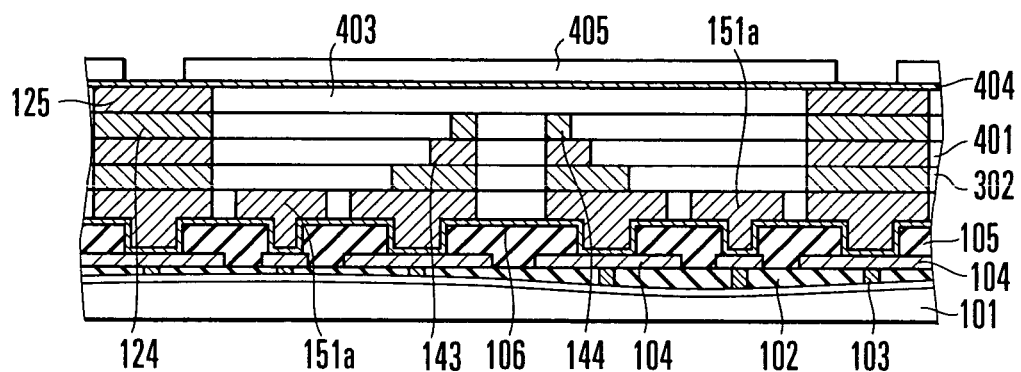

As shown in FIG. 13J, a seed layer 404 is formed from a Ti/Au metal film on the surface of the sacrificial pattern 403 including the surface of the fourth metal pattern 125. The seed layer 404 is made up of, e.g., a Ti layer 0.1 µm thick, and an Au layer 0.1 µm thick which is formed on the Ti layer. After the seed layer 404 is formed, a resist pattern (sacrificial pattern) 405 which is partially opened above the fourth metal pattern 125 is formed.

Figure 13K:
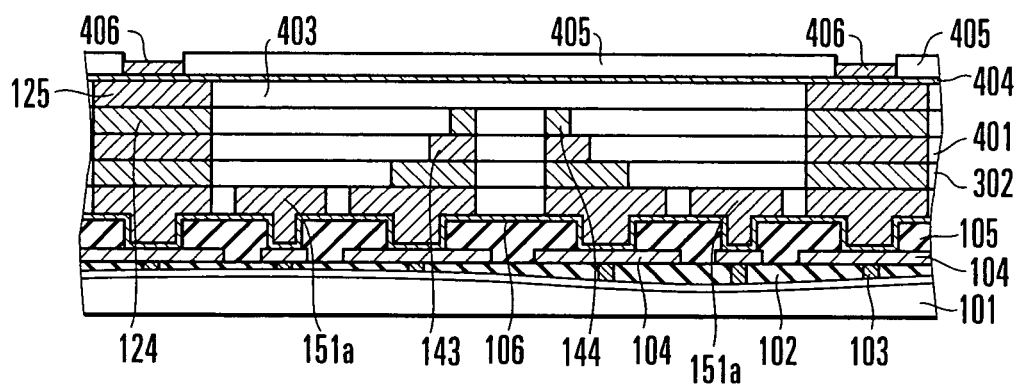
Figure 13L:
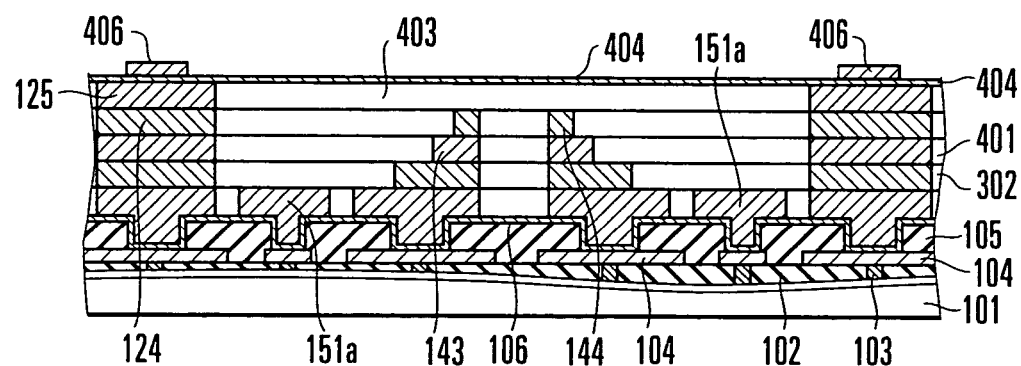
Figure 13M:
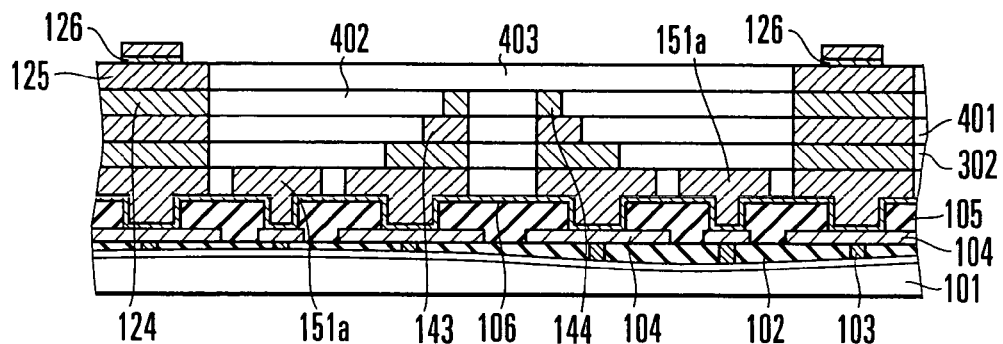

As shown in FIG. 13K, an Au metal film (fourth metal pattern) 406 about 1 µm thick is formed by electroplating on the seed layer 404 that is exposed in the opening of the resist pattern 405. As shown in FIG. 13L, the resist pattern 405 is removed, and then the seed layer 404 is etched away by wet etching using the metal film 406 as a mask, thereby forming a metal pattern 126, as shown in FIG. 13M.

Figure 13N:
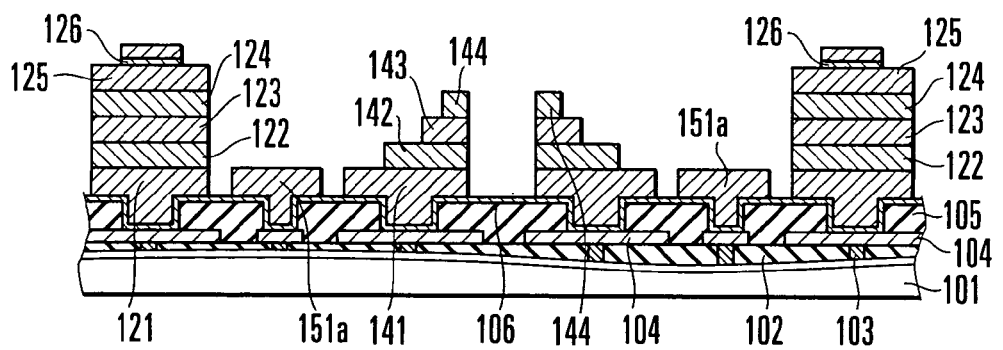

The sacrificial patterns 301, 302, 401, 402, and 403 are removed by, e.g., ashing using an ozone asher. As a result, as shown in FIG. 13N, a structure of the metal patterns 121, 122, 123, 124, 125, and 126, a structure of the metal patterns 141, 142, 143, and 144, and a structure of the third metal pattern 151a are formed with spaces between them.

Figure 13O:
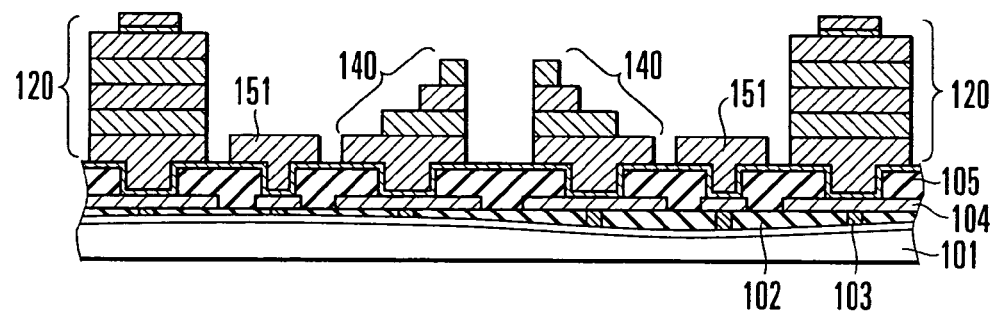

Thereafter, the seed layer 106 is selectively etched away by wet etching using the metal patterns 121, 141, and 151a as a mask, thus forming a support member 120, control electrode 140, and sensor electrode 151, as shown in FIG. 13O. A mirror substrate 130 on which a mirror 131 is pivotally arranged via coupling portions (frame coupling portions 132, mirror coupling portions 134, and a movable frame 133) is connected and fixed to the support member 120, thereby forming an optical switching device as shown in FIG. 10. The mirror substrate 130 may be connected and fixed to the support member 120 by adhesion using a solder or anisotropic conductive adhesive.

As described above, according to the fourth embodiment, the driving circuit 150 and sensor circuit 152 serving as active circuits for driving a mirror, and detecting and controlling the pivot angle of the mirror are formed on the semiconductor substrate 101. The support member 120, control electrode 140, and sensor electrode 151 are then formed, as described above. The mirror substrate 130 is connected to the support member 120 to manufacture an optical switching device. The fourth embodiment can downsize the optical switching device, and obtain a high-performance optical switching device. According to the fourth embodiment, the sensor circuit 152 detects the pivot angle of the mirror 131 on the basis of a signal from the sensor electrode 151, and the driving circuit 150 controls pivot operation of the mirror 131 on the basis of the detected pivot angle. Hence, the mirror 131 can be controlled at high precision.

Fifth Embodiment

Figure 14A:
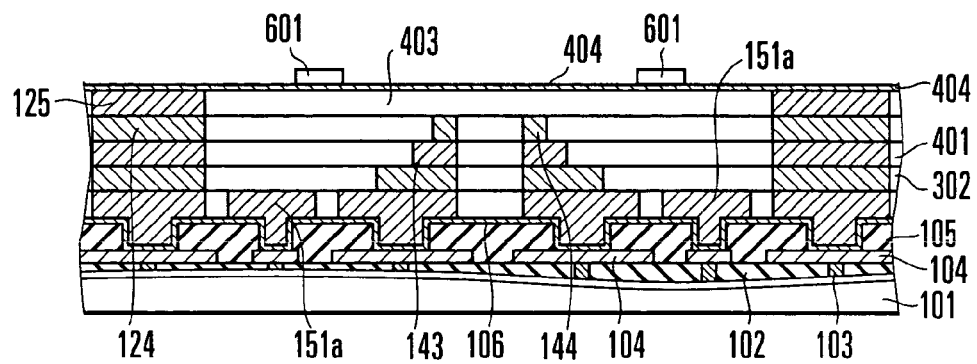
FIGS. 14A to 14D are sectional views showing an example of a method of manufacturing a semiconductor device having a MEMS according to the fifth embodiment of the present invention.

The fifth embodiment of the present invention will be described. In the fifth embodiment, steps up to those described with reference to FIGS. 13A to 13I are the same as those in the fourth embodiment, and a description thereof will be omitted. In the fifth embodiment, a sacrificial pattern 403 is formed similarly to the fourth embodiment, and a fourth metal pattern 125 is formed to the same thickness as that of the sacrificial pattern 403. As shown in FIG. 14A, a seed layer 404 is formed from an Au/Ti metal film on the surface of the sacrificial pattern 403 including the surface of the fourth metal pattern 125. The seed layer 404 is made up of, e.g., a Ti layer 0.1 µm thick, and an Au layer 0.1 µm thick which is formed on the Ti layer.

Figure 14B:
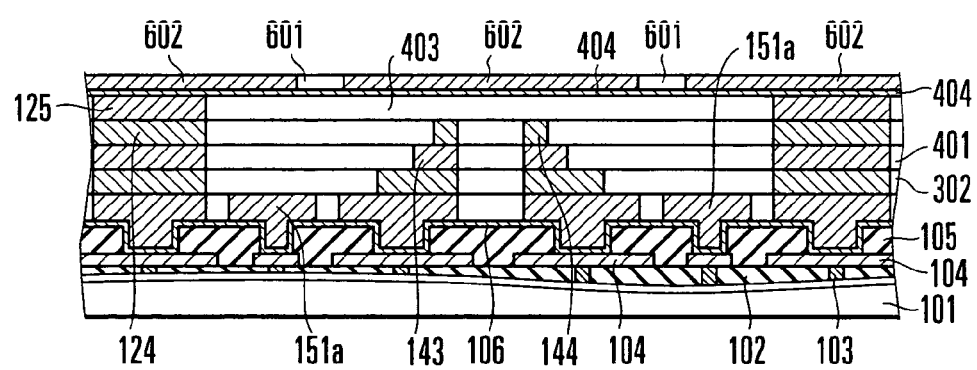
Figure 14C:
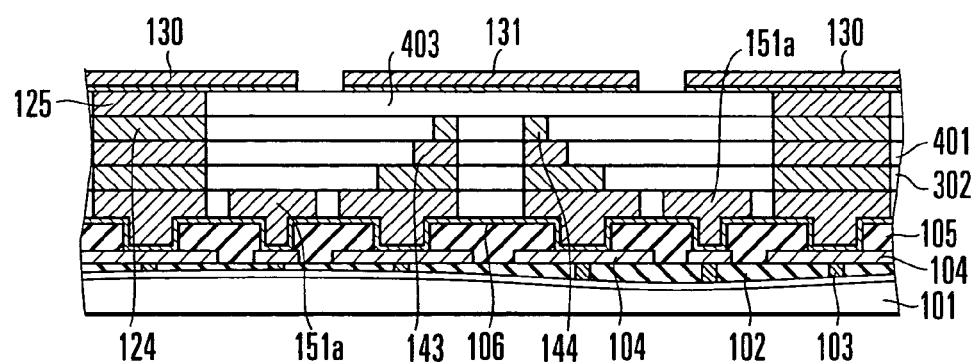

After the seed layer 404 is formed, a resist pattern 601 is formed. As shown in FIG. 14B, a 1-μm thick Au metal film 602 is formed by electroplating on the exposed seed layer 404 except the formation region of the resist pattern 601. After the resist pattern 601 is removed, the seed layer 404 is selectively removed using the metal film 602 as a mask to form a through hole, thereby forming a mirror substrate 130 and mirror 131, as shown in FIG. 14C.

The mirror 131 is fixed to the mirror substrate 130 by coupling portions (frame coupling portions 132, mirror coupling portions 134, and a movable frame 133) which act like a torsion spring. The coupling portions are formed from portions of the metal film 602 and seed layer 404 that are not covered with the resist pattern 601 between the mirror substrate 130 and the mirror 131.

Figure 14D:
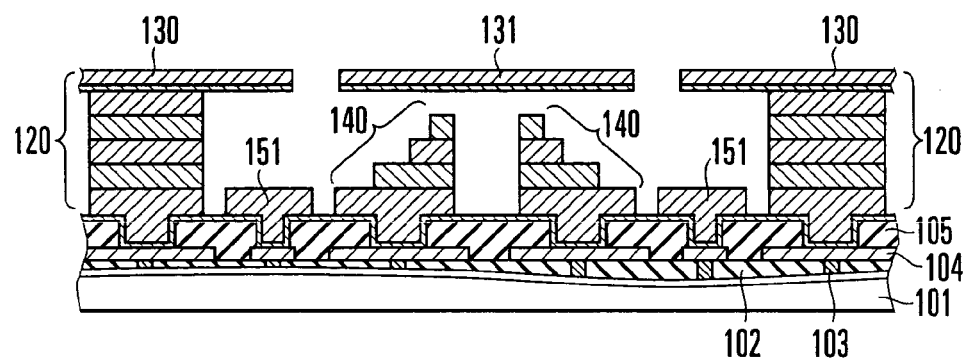

After the mirror substrate 130 and mirror 131 are formed in this manner, sacrificial patterns 301, 302, 401, 402, and 403 are ashed using, e.g., an ozone asher via an opening (through hole) between the mirror substrate 130 and the mirror 131. A seed layer 106 is selectively removed using metal patterns 121, 141, and 151a as a mask, thus forming a support member 120, control electrode 140, and sensor electrode 151 below the mirror substrate 130 and mirror 131, as shown in FIG. 14D. The mirror 131 is arranged above the control electrode 140 and sensor electrode 151 at a predetermined interval.

As described above, also in the fifth embodiment, a driving circuit 150 and sensor circuit 152 serving as active circuits for driving a mirror, and detecting and controlling the pivot angle of the mirror are formed on a semiconductor substrate 101. The support member 120, control electrode 140, and sensor electrode 151 are then formed, as described above. The mirror substrate 130 is connected to the support member 120 to manufacture an optical switching device. The fifth embodiment can downsize the optical switching device, and obtain a high-performance optical switching device. Similar to the fourth embodiment, the sensor circuit 152 detects the pivot angle of the mirror 131 on the basis of a signal from the sensor electrode 151, and the driving circuit 150 controls pivot operation of the mirror 131 on the basis of the detected pivot angle. The mirror 131 can be controlled at high precision.

In the fifth embodiment, the mirror substrate 130 is formed without adhesion, and the adhesion step can be omitted, which has a manufacturing advantage. It will readily occur to those skilled in the art that the mirror 131 can be fabricated by stacking many metal layers capable of plating with different stress characteristics so as to control the stress in order to prevent warpage of the metal mirror by the stress.

Sixth Embodiment

Figure 15A:
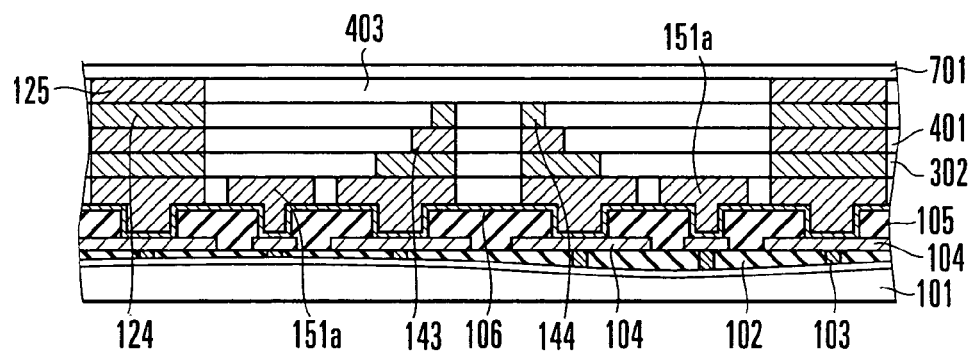
FIGS. 15A to 15D are sectional views showing an example of a method of manufacturing a semiconductor device having a MEMS according to the sixth embodiment of the present invention.

The sixth embodiment of the present invention will be described. In the sixth embodiment, steps up to those described with reference to FIGS. 13A to 13I are the same as those in the fourth embodiment, and a description thereof will be omitted. In the sixth embodiment, a sacrificial pattern 403 is formed similarly to the fourth embodiment, and a fourth metal pattern 125 is formed to the same thickness as that of the sacrificial pattern 403. As shown in FIG. 15A, a polysilicon thin film 701 is formed to a film thickness of 1 μm on the surface of the sacrificial pattern 403 including the surface of the fourth metal pattern 125 by ECR CVD capable of depositing a thin film at a relatively low temperature.

Figure 15B:
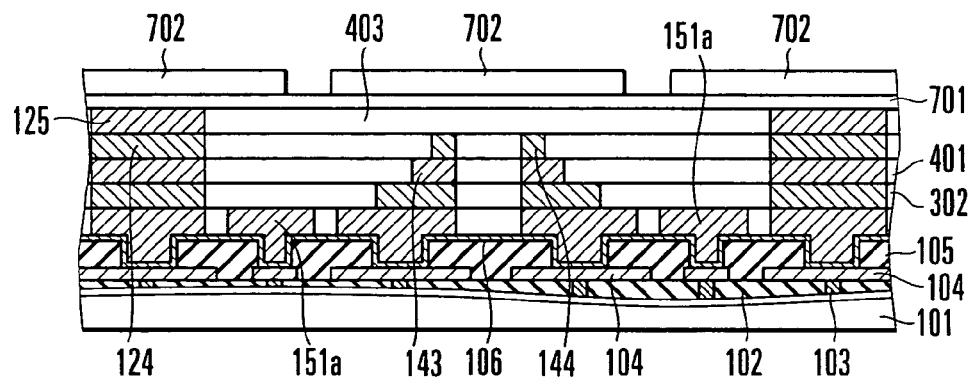
Figure 15C:
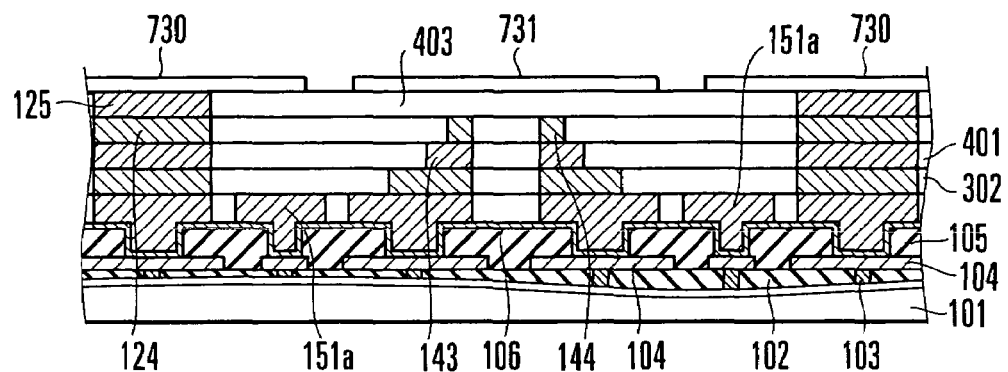

After the thin film 701 is formed, a resist pattern 702 is formed, as shown in FIG. 15B. The thin film 701 is selectively etched away from the opening of the resist pattern 702 to form a through hole. The resist pattern 702 is removed to form a mirror substrate 730 and mirror 731, as shown in FIG. 15C.

Figure 15D:
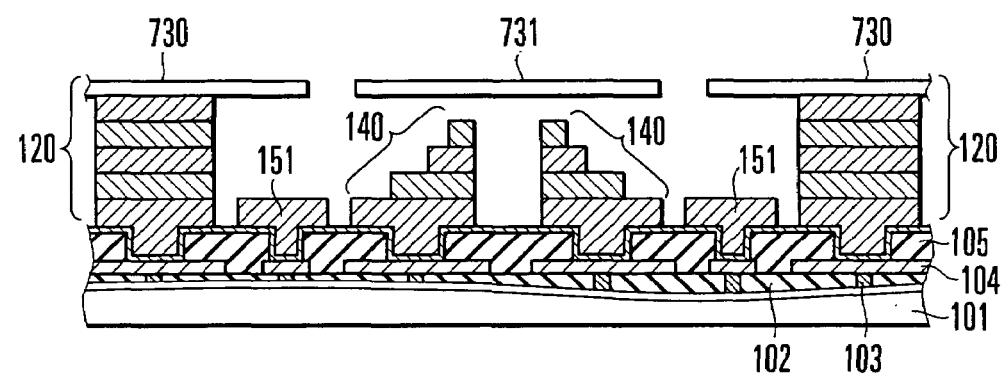

After the mirror substrate 730 and mirror 731 are formed, sacrificial patterns 301, 302, 401, 402, and 403 are ashed using, e.g., an ozone asher via an opening (through hole) between the mirror substrate 730 and the mirror 731. A seed layer 106 is selectively removed using metal patterns 121, 141, and 151a as a mask, thus forming a support member 120, control electrode 140, and sensor electrode 151 below the mirror substrate 730 and mirror 731, as shown in FIG. 15D. The mirror 731 is arranged above the control electrode 140 and sensor electrode 151 at a predetermined interval.

The mirror 731 is fixed to the mirror substrate 730 by coupling portions (frame coupling portions 132, mirror coupling portions 134, and a movable frame 133) which act like a torsion spring. The coupling portions are formed from portions of the thin film 701 below the openings of the resist pattern 702 between the mirror substrate 730 and the mirror 731.

As described above, also in the sixth embodiment, a driving circuit 150 and sensor circuit 152 serving as active circuits for driving a mirror, and detecting and controlling the pivot angle of the mirror are formed on a semiconductor substrate 101. The support member 120, control electrode 140, and sensor electrode 151 are then formed, as described above. The mirror substrate 730 is connected to the support member 120 to manufacture an optical switching device. The sixth embodiment can downsize the optical switching device, and obtain a high-performance optical switching device. Similar to the fourth embodiment, the sensor circuit 152 detects the pivot angle of the mirror 731 on the basis of a signal from the sensor electrode 151, and the driving circuit 150 controls pivot operation of the mirror 731 on the basis of the detected pivot angle. The mirror 731 can be controlled at high precision. In the sixth embodiment, the mirror substrate 730 is formed without adhesion, and the adhesion step can be omitted, which has a manufacturing advantage.

The support member 120, control electrode 140, and sensor electrode 151 are formed by copper plating in the fourth to sixth embodiments, but may be formed by plating a metal capable of plating, such as gold. In this case, a seed layer is made of Ti/Au.

As described above, according to the fourth to sixth embodiments, a driving circuit is formed on a semiconductor substrate, and a mirror element comprised of a mirror whose operation is controlled by the driving circuit is formed above the driving circuit. These embodiments can manufacture a finer optical switching device more easily than the prior art while suppressing decreases in the degree of integration and yield. A sensor electrode is formed below the mirror, and a sensor circuit is formed on the semiconductor substrate. The sensor circuit detects the pivot angle of the mirror on the basis of a signal from the sensor electrode, and the driving circuit controls pivot operation of the mirror on the basis of the detected pivot angle. The mirror can be controlled at high precision.

If the conductive mirror 131 and control electrode 140 are rendered conductive upon contact, the contact portions react and are joined, and the mirror 131 and control electrode 140 may not return to the original state by the elastic force of the mirror 131. This phenomenon is called sticking or fixation, and may pose a problem in driving the mirror. This phenomenon is estimated to occur when a kind of resistance welding occurs because contact between the mirror and the control electrode upon application of a high voltage is the same as so-called spot welder.

To avoid the sticking phenomenon, at least one contact surface is made nonconductive. For this purpose, for example, an organic thin film serving as an insulator is formed as a protective film on the control electrode.

For example, before the mirror substrate 130 having the mirror 131 is arranged on the support member 120, an organic material is applied to the interlayer dielectric layer 105 on which the control electrode 140 and support member 120 are formed, thereby forming a protective film formed an insulator which covers the control electrode 140. However, the organic film is also formed on the support member 120 by coating. A photosensitive organic film must be formed and patterned by known photolithography to remove an unnecessary portion.

For a complicated three-dimensional structure as shown in FIG. 10, patterning is done by photolithography using ultra-deep exposure. Formation of an organic film which covers the control electrode 140 requires many photomasks. Because of the presence of a large step, no organic film may be formed in a region where an organic film is to be formed, e.g., above the control electrode 140 owing to poor step coverage of a coating film in forming a film by applying an organic material.

In this case, even in a complicated three-dimensional structure, sticking can be prevented by partially forming an organic film on, e.g., the control electrode 140 by the following method.

Figure 16A:
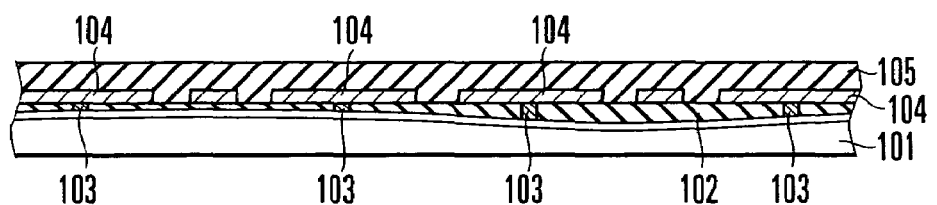
FIGS. 16A to 16N are sectional views showing another example of the method of manufacturing a semiconductor device having a MEMS according to the sixth embodiment of the present invention.

As shown in FIG. 16A, active circuits (not shown) which constitute the above-mentioned driving circuit and the like are formed on a semiconductor substrate 101 of a semiconductor such as silicon, and then an interlayer dielectric layer 102 of silicon oxide is formed. A connection port is formed in the interlayer dielectric layer 102, and an interconnection layer 104 is formed and connected to a lower interconnection via the connection port and connection electrode 103.

This structure can be formed by known photolithography and etching. For example, the active circuits can be fabricated by a CMOS LSI process. The connection electrode 103 and interconnection layer 104 can be formed by forming and processing an Au/Ti metal film. The metal film is made up of a Ti lower layer about 0.1 µm thick and an Au upper layer about 0.3 µm thick.

The metal film is formed as follows. Au and Ti are formed on the silicon oxide film by sputtering or vapor deposition. A predetermined pattern is then formed by photolithography. At this time, an electrode interconnection, a connection portion for adhering a mirror substrate to be described later, and a resist pattern for forming a wire bonding pad are simultaneously formed. The Au/Ti film is selectively removed by wet etching using the resist pattern as a mask, and then the resist pattern is removed to form an interconnection layer 104. The interconnection layer 104 has the electrode interconnection, the connection portion for connecting a mirror substrate to be described later, and the wire bonding pad (not shown).

After these layers are formed, an interlayer dielectric layer 105 is formed to cover the interconnection layer 104. The interlayer dielectric layer 105 can be formed from a polyimide film prepared by applying polybenzoxazole serving as a photosensitive organic resin to a film thickness of several µm. The interlayer dielectric layer 105 may be formed from another insulating material.

Figure 16B:
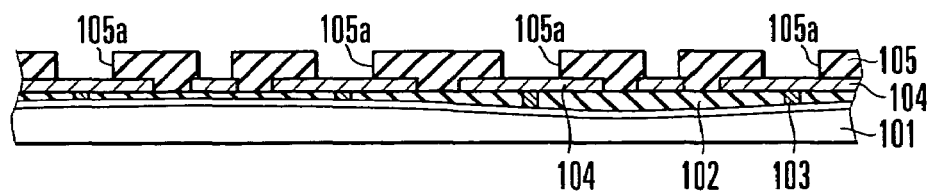

As shown in FIG. 16B, an opening 105a is formed in the interlayer dielectric layer 105 to expose a predetermined portion of the interconnection layer 104. When the interlayer dielectric layer 105 is formed from a photosensitive organic resin, as described above, a pattern is formed by exposure and developing so as to open the region of the opening 105a. After the pattern is formed, the film is annealed and cured to form an interlayer dielectric layer 105 having the opening 105a.

Figure 16C:
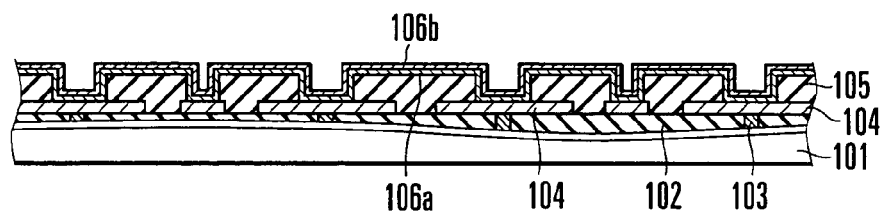

As shown in FIG. 16C, for example, a Ti lower seed layer 106a about 0.1 µm thick is formed to cover the interlayer dielectric layer 105 including the interior of the opening 105a. In addition, for example, an Au upper seed layer 106b about 0.3 µm thick is formed on the lower seed layer 106a.

Figure 16D:
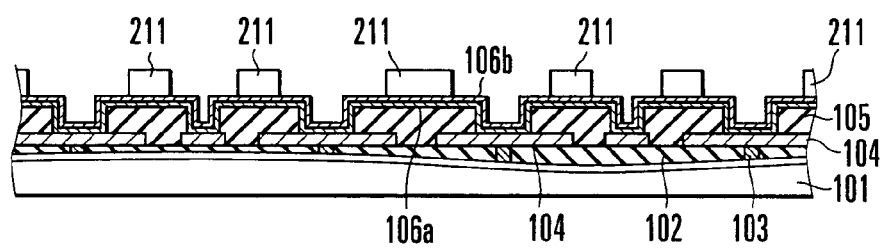

As shown in FIG. 16D, a sacrificial pattern 211 having a film thickness of about 17 µm at a flat portion is formed. The sacrificial pattern 211 has openings for forming a metal pattern 141 serving as a control electrode 140 to be described later and a metal pattern 151a serving as a sensor electrode 151 to be described later.

The sacrificial pattern 211 can be formed by processing, e.g., a film of polybenzoxazole serving as a photosensitive organic resin by photolithography. For example, a polyimide film formed by applying polybenzoxazole is exposed and developed with a contact aligner using a photomask and a stepper using a reticle so as to open, by photolithography, portions where a control electrode pattern, a sensor electrode pattern, a connection portion for connecting a mirror substrate, and a wire bonding pad are to be formed. The photosensitive portion is dissolved in a developing solution, thereby forming a sacrificial pattern 211 having desired opening regions.

Figure 16E:
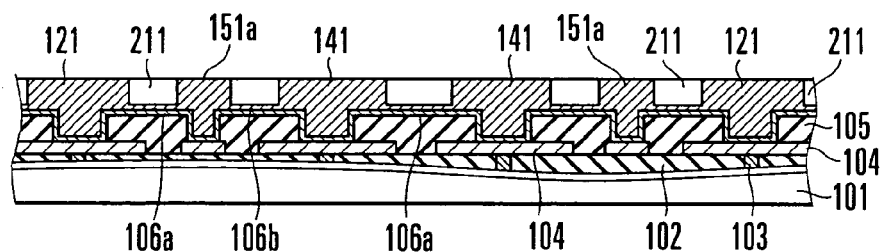

As shown in FIG. 16E, Au metal patterns 121, 141, and 151a are formed by electroplating to the same thickness as that of the sacrificial pattern 211 on the upper seed layer 106b which is exposed in the opening portions of the sacrificial pattern 211. At this time, the surfaces of the metal patterns 121, 141, and 151a and the sacrificial pattern 211 are made flat so as to be almost flush with each other. Portions where the Au metal patterns 121 and 141 are formed are integrated with the underlying Au upper seed layer 106b.

Figure 16F:
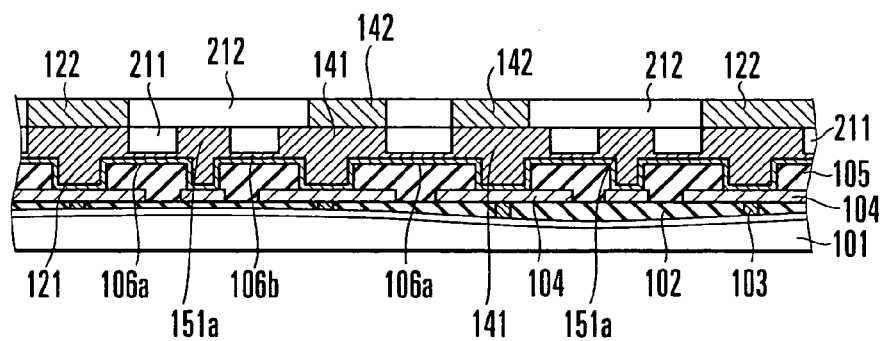

As shown in FIG. 16F, a sacrificial pattern 212 having a film thickness of about 17 µm at a flat portion is formed by the same process as described above. Au metal patterns 122 and 142 are formed by electroplating to the same thickness as that of the sacrificial pattern 212 on the metal patterns 121 and 141 which are exposed in the openings of the sacrificial pattern 212. At this time, the metal pattern 151a is covered with the sacrificial pattern 212.

Figure 16G:
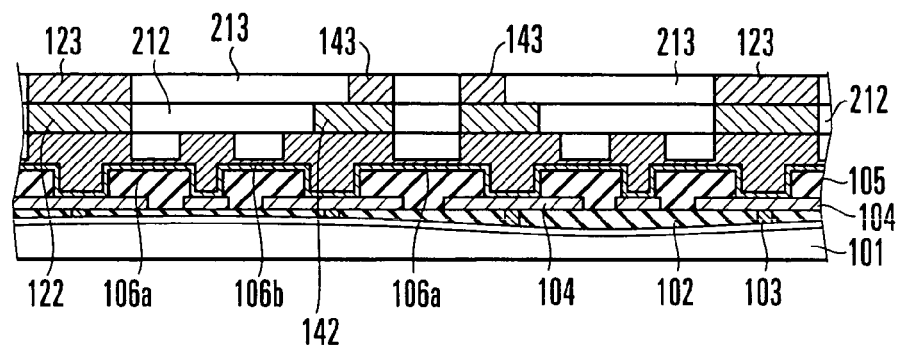

As shown in FIG. 16G, a sacrificial pattern 213 having a film thickness of about 17 µm at a flat portion is formed by the same process as described above. Au metal patterns 123 and 143 are formed by electroplating to the same thickness as that of the sacrificial pattern 213 on the metal patterns 122 and 142 which are exposed in the openings of the sacrificial pattern 213.

Figure 16H:
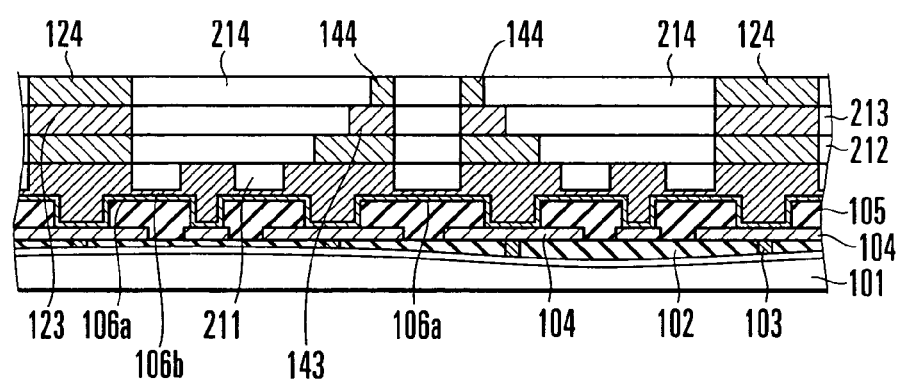

As shown in FIG. 16H, a sacrificial pattern 214 having a film thickness of about 17 µm at a flat portion is formed by the same process as described above. Au metal patterns 124 and 144 are formed by electroplating to the same thickness as that of the sacrificial pattern 214 on the metal patterns 123 and 143 which are exposed in the openings of the sacrificial pattern 214.

Figure 16I:
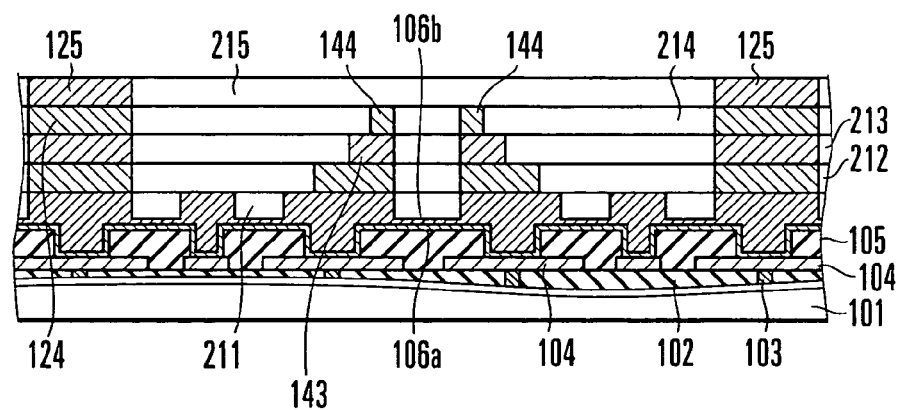

As shown in FIG. 16I, a sacrificial pattern 215 having a film thickness of about 17 µm at a flat portion is formed by the same process as described above. An Au metal pattern 125 is formed by electroplating to the same thickness as that of the sacrificial pattern 215 on the metal pattern 124 which is exposed in the opening of the sacrificial pattern 215. No opening is formed in the sacrificial pattern 215 above the metal pattern 144, and the metal pattern 144 is covered with the sacrificial pattern 215.

Figure 16J:
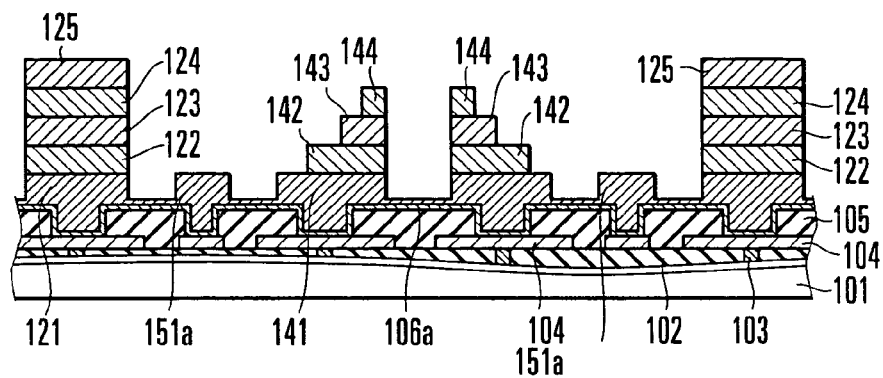

The sacrificial patterns 211, 212, 213, 214, and 215 are removed by, e.g., ashing using an ozone asher. As a result, as shown in FIG. 16J, a structure of the metal patterns 121, 122, 123, 124, and 125, a structure of the metal patterns 141. 142. 143, and 144 and the metal pattern 151*a* are formed with spaces between them.

Figure 16K:
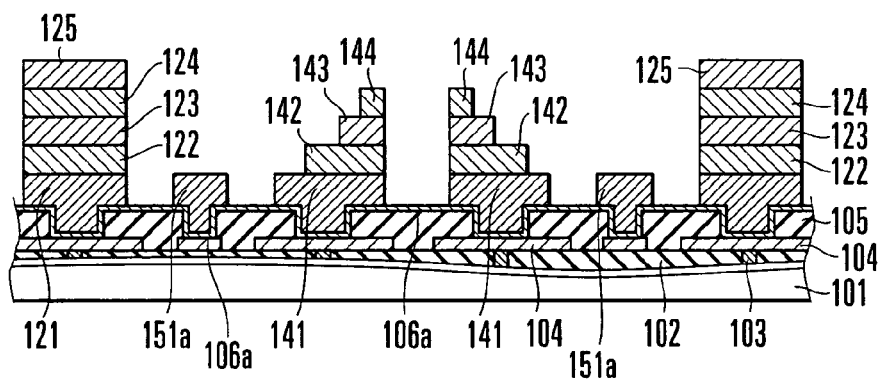

Thereafter, the Au upper seed layer 106*b* is selectively etched away by wet etching with an iodine-ammonium iodide solution using the metal patterns 121, 141, and 151*a* as a mask, exposing the lower seed layer 106*a* between the first metal patterns 121, 141, and 151*a* as shown in FIG. 16K. The metal patterns 121, 122, 123, 124, and 125 constitute a support member 120, the metal patterns 141, 142, 143, and 144 constitute a control electrode 140, and the third metal pattern 151*a* constitutes a sensor electrode 151.

Figure 16L:
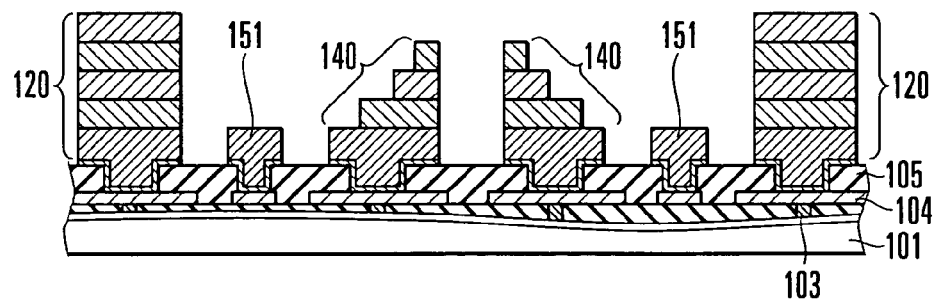

The lower seed layer 106*a* is selectively removed by wet etching with a hydrofluoric acid solution using the support member 120, control electrode 140, and third metal pattern 151*a* as a mask. Consequently, as shown in FIG. 16L, the upper surface of the interlayer dielectric layer 105 is exposed except the regions of the support member 120, control electrode 140, and sensor electrode 151. With this structure, the support member 120, control electrode 140, and sensor electrode 151 are insulated from each other on the interlayer dielectric layer 105.

As shown in FIG. 16M, a photosensitive resin pattern 411 is formed by stencil printing such as screen printing so as to cover the control electrode 140. The photosensitive resin pattern 411 is formed from, e.g., photosensitive polybenzoxazole.

Formation of the photosensitive resin pattern 411 by this printing method will be briefly explained. A screen whose outer surface is covered with a plate film having an opening pattern corresponding to the region where the control electrode 140 is formed is prepared. The screen is attached to a predetermined frame.

The relative positional relationship between the semiconductor substrate 101 and the screen is adjusted such that the opening pattern of the plate film is arranged above the control electrode 140 with the formation surface (outer surface) of the plate film facing toward the control electrode 140. After the relative positional relationship is adjusted, photosensitive polybenzoxazole described above is applied to a surface (inner surface) of the screen on which no plate film is formed. The screen and semiconductor substrate 101 are moved close to each other at a predetermined interval, and then fixed. The inner surface of the screen is press-slid with a squeegee.

Accordingly, part of polybenzoxazole passes through the mesh of the screen which is exposed in the opening of the plate film. A photosensitive resin pattern 411 which covers the control electrode 140 of the semiconductor substrate 101 can be formed from passing polybenzoxazole. The film thickness of the photosensitive resin pattern 411 is controlled by the viscosity of polybenzoxazole, the applied pressure of the squeegee, and the like. The film thickness of the photosensitive resin pattern 411 is adjusted to, e.g., about 1 μm.

By forming the photosensitive resin pattern 411 by this printing method, a resin pattern having a desired film thickness can be formed without any influence of a peripheral structure such as the support member 120.

If the plate film can sufficiently stand press sliding with the squeegee, the photosensitive resin pattern 411 of photosensitive polybenzoxazole can also be stenciled (printed) by only the plate film without any screen mesh.

A desired region of the photosensitive resin pattern 411 including the top of the control electrode 140 is exposed and developed, forming a protective film 412 which covers a predetermined region including the top of the control electrode 140, as shown in FIG. 16N. For example, if the photosensitive resin pattern 411 is negatively photosensitive, the formation region of the protective film 412 shown in FIG. 16N is irradiated with exposure light and then developed. By this process, the protective film 412 can be formed in a desired region.

The prior art requires photolithography using ultra-deep exposure in order to form the above-mentioned pattern on a complicated three-dimensional structure such as the control electrode 140.

To the contrary, according to this manufacturing method, the photosensitive resin pattern 411 about 1 μm thick is formed in the region of the control electrode 140 by printing. The protective film 412 can be patterned by known photolithography.

The frame of a mirror substrate (mirror structure) 130 on which a mirror (plate-like movable portion) 131 is pivotally arranged via coupling portions (not shown) is connected and fixed onto the support member 120, forming an optical switching element shown in FIG. 17. The mirror substrate 130 may be connected and fixed to the support member 120 by adhesion using a solder or anisotropic conductive adhesive.

The optical switching element shown in FIG. 17 will be described. The optical switching element is constituted by the mirror substrate 130 which is supported by the conductive support members 120 on the interlayer dielectric layer 105 formed in the semiconductor substrate 101 and has an opening region, the mirror 131 which is pivotally arranged in the opening region of the mirror substrate 130, and the control electrodes 140, driving circuit 150, sensor electrodes 151, and sensor circuits 152 for pivoting the mirror 131. For example, the support member 120 control electrode 140, and sensor electrode 151 are arranged on the same plane on the interlayer dielectric layer 105. The support member 120, control electrode 140, and sensor electrode 151 are integrated on, e.g., a silicon semiconductor substrate 101. The formation portions of the driving circuit 150 and sensor circuit 152 are arranged below the interlayer dielectric layer 102. The control electrode 140, sensor electrode 151, and support member 120 are connected to the interconnection layer 104 arranged below the interlayer dielectric layer 105. This arrangement is the same as that shown in FIG. 10.

As described above, according to this manufacturing method, the surface of the control electrode 140 is covered with the protective film 412 formed from an insulating resin. This can prevent fixation between, e.g., the upper portion of the control electrode 140 and the lower surface of the mirror 131.

According to this manufacturing method, even if a structure having a large step such as the control electrode 140 is formed, a protective film can be uniformly formed on the surface of a complicated structure without using many photomasks and increasing the number of process.

In this manufacturing method, a photosensitive resin pattern is formed by printing, and patterned by general photolithography into a protective film which covers a desired region of the control electrode.

Printing alone makes it difficult to form a resin pattern on part of the control electrode in the arrangement of the fine control electrode and support member. However, the above-described printing can form a pattern at a desired film thickness in the control electrode region without any influence of a complicated three-dimensional structure such as the support member. The pattern can be formed at a low film thickness, and patterned by general photolithography.

According to this manufacturing method, a photosensitive resin pattern having a desired film thickness is formed only in a region near the control electrode, and then patterned by known photolithography. Even in the presence of a large step in the support member or the like, a protective film can be formed in a desired region.

In the above description, four layered metal patterns form a control electrode, and five layered metal patterns form a support member such that the support member becomes higher than the control electrode. However, the present invention is not limited to this. The metal pattern portions of the control electrode and support member, which are formed by identical layers, have the same thickness. When the number of layered metal patterns of the support member is larger than that of the control electrode by at least one, the support member is set higher than the control electrode. For example, the support member may be formed from two metal layered patterns, and the control electrode may be formed from one metal pattern. By setting the support member higher, the mirror can be moved even if the control electrode exists below the mirror fixed onto the support member.

In the above-described manufacturing method, a resin pattern formed by stencil printing is patterned by photolithography to form a protective film which covers at least the top of the control electrode. As a result, a protective film can be easily formed even on a control electrode which is formed in a complicated three-dimensional structure. In an optical switching element, a movable portion such as a mirror can continue smooth operation without directly contacting the control electrode in driving.

Seventh Embodiment

Figure 18:
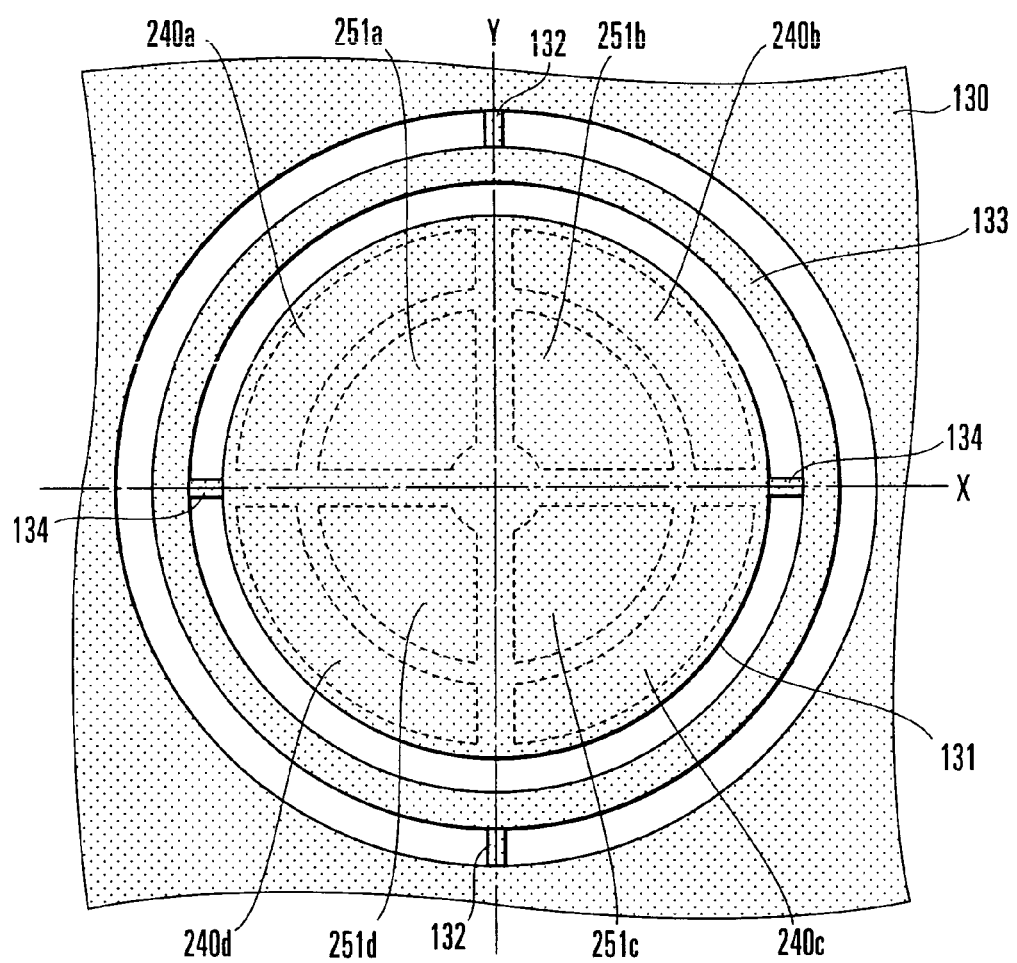
FIG. 18 is a plan view showing part of an arrangement example of a semiconductor device having a MEMS according to the seventh embodiment of the present invention.
Figure 19:
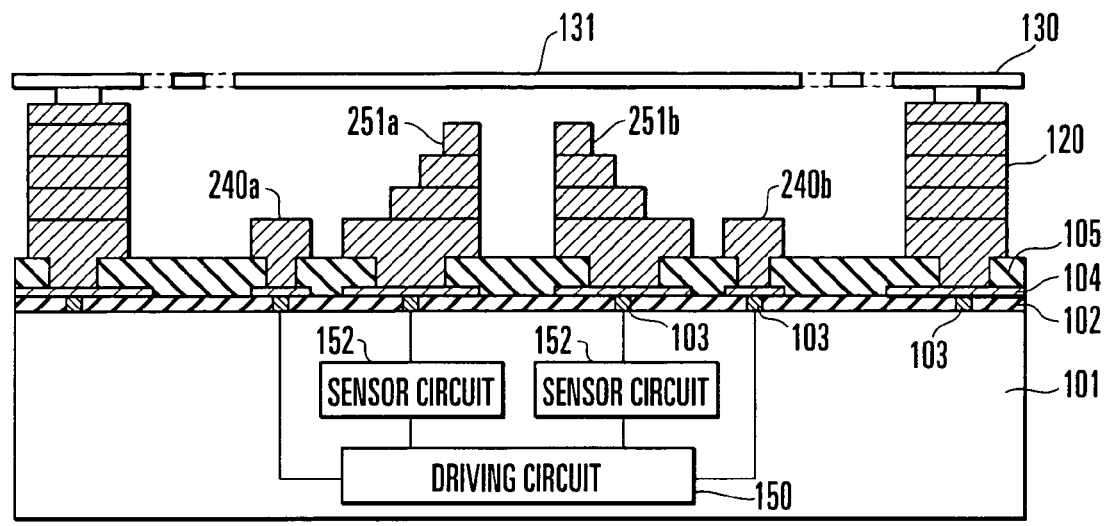
FIG. 19 is a sectional view showing part of the arrangement example of the semiconductor device having the MEMS according to the seventh embodiment of the present invention.

The seventh embodiment of the present invention will be described in detail below with reference to the accompanying drawings. Similar to the above embodiments, an optical switching device will be exemplified as a semiconductor device having a MEMS system. FIG. 18 shows an optical switching device according to the seventh embodiment of the present invention. FIG. 19 shows the section of the optical switching device in FIG. 18. FIGS. 18 and 19 mainly illustrate a portion (mirror element) formed from one mirror as one building unit of the optical switching device. For example, at least a driving circuit 150 and sensor circuits 152 are formed on a semiconductor substrate 101 of, e.g., silicon. An interlayer dielectric layer 102 of, e.g., silicon oxide, an interconnection layer 104 of, e.g., Au/Ti, and an interlayer dielectric layer 105 of, e.g., polyimide are formed on the semiconductor substrate 101.

A support member 120 of a metal such as Cu is selectively formed on the semiconductor substrate 101 via the interlayer dielectric layer 105. The support member 120 is conductive, and is electrically connected to the interconnection layer 104 via a through hole formed in the interlayer dielectric layer 105. The support member 120 receives a predetermined potential (e.g., ground potential) via a connection electrode 103 formed in the interlayer dielectric layer 102.

A mirror substrate 130 is supported apart from the semiconductor substrate 101 by the support member 120. The mirror substrate 130 is conductive, is electrically connected to the support member 120, and has an opening region where a mirror 131 is arranged. FIG. 11 shows an optical switching device having a plurality of mirror elements. As shown in FIG. 11, mirrors 131 are arranged in a plurality of opening regions of the mirror substrate 130, and one mirror 131 forms one mirror element. As shown in FIG. 18, each mirror element comprises the mirror 131, control electrodes 240 (240a, 240b, 240c, and 240d), and sensor electrodes 251 (251a, 251b, 251c, and 251d).

A movable frame 133 and the mirror 131 are arranged in the opening region of the mirror substrate 130, and the mirror 131 is formed in almost a circle when viewed from the top. The movable frame 133 is pivotally coupled to the mirror substrate 130 via a pair of frame coupling portions 132. The mirror 131 is pivotally coupled to the movable frame 133 via a pair of mirror coupling portions 134. Each coupling portion is a spring member such as a torsion spring.

The movable frame 133 can pivot on, as a pivot axis, an axis (Y in FIG. 18) which passes through the pair of frame coupling portions 132 and is parallel to the mirror substrate 130. The mirror 131 can pivot on, as a pivot axis, an axis (X in FIG. 18) which passes through the pair of mirror coupling portions 134 and is parallel to the movable frame 133. Thus, the mirror 131 can pivot on, as pivot axes, the two axes, i.e., the axis Y which passes through the pair of frame coupling portions 132 and the axis X which passes through the pair of mirror coupling portions 134.

The mirror 131 is conductive, and is electrically connected to the mirror substrate 130 via the conductive coupling portions (frame coupling portions 132, mirror coupling portions 134, and movable frame 133). The mirror 131 receives a predetermined potential (e.g., ground potential) via the interconnection layer 104, support member 120, mirror substrate 130, and coupling portions.

As also shown in FIG. 11, the optical switching device according to the seventh embodiment comprises a plurality of mirror elements which are arrayed (integrated) in a matrix. The control electrodes 240a, 240b, 240c, and 240d of each mirror element are connected to the driving circuit 150. The sensor electrodes 251a, 251b, 251c, and 251d are connected to the sensor circuits 152. The sensor circuits 152 and driving circuit 150 are almost identical to those of the optical switching device shown in FIG. 10.

In the optical switching device shown in FIGS. 18 and 19, the sensor electrodes 251a, 251b, 251c, and 251d of a metal such as Cu are arranged below the mirror 131 to detect the posture of the mirror 131 which pivots. The sensor electrodes 251a, 251b, 251c, and 251d are selectively formed on the interlayer dielectric layer 105, and arranged below the mirror 131 (except portions immediately below the pivot axes X and Y) at a predetermined distance from the mirror 131. At least one sensor electrode 251 is arranged on one side or each of two sides of one pivot axis for one mirror 131. In the seventh embodiment, the sensor electrodes 251 are arranged on the two sides of each pivot axis, the two pivot axes X and Y are used, and thus a total of four sensor electrodes 251a, 251b, 251c, and 251d are arranged.

The sensor electrodes 251a, 251b, 251c, and 251d are connected to the sensor circuits 152 formed on the semiconductor substrate 101 below the interlayer dielectric layer 102 via through holes formed in the interlayer dielectric layer 105, the interconnection layer 104, and the connection electrodes 103 formed in the interlayer dielectric layer 102.

The sensor circuits 152 are integrated circuits of elements and interconnections formed on the semiconductor substrate 101. The sensor circuits 152 detect the posture of the mirror 131, i.e., the pivot angle around the axis X serving as a pivot axis and the pivot angle around the axis serving as a pivot axis by detecting four electrostatic capacitances corresponding to the distances between the mirror 131 and the sensor electrodes 251a, 251b, 251c, and 251d that change depending on the posture of the mirror 131.

An electrostatic capacitance C per unit area that is induced between an arbitrary point on the mirror 131 and the sensor electrode 251 facing the arbitrary point is given by $$C=\epsilon/d \tag{1}$$

where $\epsilon$ is the permittivity in the space, and d is the distance between the arbitrary point on the mirror 131 and the sensor electrode 251. The sensor circuit 152 detects the electrostatic capacitance C to detect the distance d between the mirror 131 and the sensor electrode 251. The sensor circuit 152 detects the pivot angle of the mirror 131 from the distance d and a predetermined position of the pivot axis of the mirror 131. A signal representing the pivot angle of the mirror 131 detected by the sensor circuit 152 is fed back to the driving circuit 150.

The control electrodes 240a, 240b, 240c, and 240d of a metal such as Cu are arranged below the mirror 131 to control the posture of the mirror 131. The control electrodes 240a, 240b, 240c, and 240d are selectively formed on the semiconductor substrate 101 via the interlayer dielectric layer 105, and arranged below the mirror 131 (except portions immediately below the axes X and Y) at a predetermined distance from the mirror 131. At least one control electrode 240 is arranged on one side or each of two sides of one pivot axis for one mirror 131. In the seventh embodiment, the control electrodes 240 are arranged on the two sides of each pivot axis, the two pivot axes X and Y are used, and thus a total of four control electrodes 240a, 240b, 240c, and 240d are arranged.

The control electrodes 240a, 240b, 240c, and 240d are connected to the driving circuit 150 formed on the semiconductor substrate 101 via through holes formed in the interlayer dielectric layer 105, the interconnection layer 104, and the connection electrodes 103 formed in the interlayer dielectric layer 102.

The driving circuit 150 is an integrated circuit of an element and interconnection formed on the semiconductor substrate 101. The driving circuit 150 recognizes the pivot angle of the mirror 131 from signals fed back from the sensor circuits 152, and applies to the control electrodes 240a, 240b, 240c, and 240d a voltage for controlling the pivot state (pivot amount) of the mirror 131 so as to adjust the pivot angle of the mirror 131 detected by the sensor circuits 152 to a desired value (e.g., a value set by an external system).

When the driving circuit 150 applies a voltage to the control electrodes 240a, 240b, 240c, and 240d to generate a potential difference between the control electrodes 240a, 240b, 240c, and 240d and the mirror 131, charges are induced to portions of the mirror 131 that face the control electrodes 240a, 240b, 240c, and 240d. The mirror 131 pivots by an electrostatic force (Coulomb force) which acts on the charges. The mirror 131 stops at a position where a torque around the pivot axis by the electrostatic force and an opposite torque generated at a torsion spring (coupling portion) balance with each other.

The driving circuit 150 and sensor circuit 152 may be arranged for one mirror element. Alternatively, one driving circuit 150 and one sensor circuit 152 can simultaneously desirably control a plurality of mirror elements.

As described above, according to the seventh embodiment, the sensor circuit 152 detects the pivot angle of the mirror 131 on the basis of a signal from the sensor electrode 251, and the driving circuit 150 controls pivot operation of the mirror 131 on the basis of the detected pivot angle. The mirror 131 can be controlled at high precision, increasing the operating speed of the optical switching device.

The control electrode 240 and sensor electrode 251 are arranged outward from the center of the mirror 131. In the seventh embodiment, the sensor electrode 251 is arranged closer to the center of the mirror 131 than the control electrode 240. The effects of this arrangement will be explained. The distances between the control electrode 240, the sensor electrode 251, and the mirror 131 change depending on pivot of the mirror 131. The degree of change is larger at the periphery of the mirror 131 than its center. From this, the heights of the control electrode 240 and sensor electrode 251 must be set in consideration of pivot of the mirror 131.

In the seventh embodiment, the sensor electrode 251 is arranged near the center of the mirror 131, and the control electrode 240 is arranged outside the sensor electrode 251. The sensor electrode 251 can be set higher than the control electrode 240, the distance d between the mirror 131 and the sensor electrode 251 can be shortened, and the electrostatic capacitance C detected by the sensor circuit 152 can be increased. The distance d and the pivot angle of the mirror 131 can, therefore, be easily detected.

Also in the semiconductor device having the MEMS shown in FIG. 19, sticking of the mirror 131 is prevented by an insulating resin protective film. In this case, the protective film is so formed as to cover the sensor electrode 251 closer to the mirror 131. When the control electrode 240 is closer to the mirror 131, a protective film may be formed on the control electrode 240. The protective film can be formed only by screen printing. For example, a predetermined resin pattern may be formed by stencil printing to form a protective film which covers at least the top of the control electrode.

As has been described above, according to the present invention, a plurality of units having movable portions for constituting a MEMS are monolithically mounted on a semiconductor substrate on which an integrated circuit including a driving circuit, sensor circuit, memory, and processor is formed. Each unit has a processor, memory, driving circuit, and sensor circuit.

The present invention can downsize the MEMS because many control signal lines and a large control device which controls motion of a MEMS structure need not be used.

What is claimed is:

1. A semiconductor device having a MEMS, comprising:
   a semiconductor substrate (1) on which an integrated circuit is formed; and
   a plurality of units (2) which are formed on said semiconductor substrate and comprise movable portions (202) that physically move on the basis of a first electrical signal, each of said units comprising at least
   a control electrode (21) which supplies a control signal for causing the movable portion to physically move,
   a driving circuit (22) which outputs the control signal to the control electrode on the basis of the first electrical signal,
   a sensor electrode (23) which detects physical motion of the movable portion,
   a sensor circuit (24) which generates a second electrical signal corresponding to physical motion of the movable portion on the basis of a signal from the sensor electrode,
   a memory (25) which holds an externally input setting value, and a processor (26) which generates the first electrical signal on the basis of the setting value held in the memory, and controls output of the control signal from the driving circuit on the basis of the generated first electrical signal and the second electrical signal, thereby controlling operation of the movable portion, wherein the driving circuit, the sensor circuit, the memory, and the processor are constituted by part of the integrated circuit, and wherein the movable portion includes a mirror which is rotatably coupled to a mirror substrate, the mirror substrate is supported by a support member which is formed from a conductive material on said semiconductor substrate via an interlayer dielectric layer, the control electrode and the sensor electrode are arranged on the interlayer dielectric layer below the mirror so as to be insulated from the support member, and the mirror is arranged at a predetermined distance above the control electrode and the sensor electrode.

2. A device according to claim 1, wherein the sensor electrode is arranged outside the control electrode in a region below the mirror.

3. A device according to claim 1, wherein the control electrode is arranged outside the sensor electrode in a region below the mirror.

4. A device according to claim 1, further comprising an insulating resin protective film (412) which covers an upper surface of the control electrode.

5. A device according to claim 1, further comprising an insulating resin protective film which covers an upper surface of the sensor electrode.

* * * * *